(12) United States Patent
Kim et al.

(10) Patent No.: US 10,832,615 B2
(45) Date of Patent: Nov. 10, 2020

(54) DISPLAY PANEL INCLUDING INORGANIC LIGHT EMITTING DEVICE AND DRIVING CIRCUIT

(71) Applicant: SAMSUNG ELECTRONICS CO., LTD., Suwon-si (KR)

(72) Inventors: Jinho Kim, Suwon-si (KR); Kisun Kang, Suwon-si (KR); Sangmin Shin, Suwon-si (KR); Hoseop Lee, Suwon-si (KR); Youngki Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/263,963

(22) Filed: Jan. 31, 2019

(65) Prior Publication Data

US 2019/0371232 A1    Dec. 5, 2019

(30) Foreign Application Priority Data

Jun. 1, 2018 (KR) .................. 10-2018-0063604
Aug. 21, 2018 (KR) .................. 10-2018-0097404

(51) Int. Cl.
  *G09G 3/32*    (2016.01)
  *G09G 3/20*    (2006.01)
  *H01L 27/15*    (2006.01)

(52) U.S. Cl.
  CPC .............. *G09G 3/32* (2013.01); *G09G 3/2003* (2013.01); *G09G 3/2011* (2013.01);
  (Continued)

(58) Field of Classification Search
  CPC .............. G09G 3/2011; G09G 3/2014; G09G 2300/0452
  See application file for complete search history.

(56) References Cited

U.S. PATENT DOCUMENTS 5,852,430 A * 12/1998 Endo .................... G09G 3/3607
                                                                   345/101
9,401,120 B2   7/2016 Xiao
(Continued)

FOREIGN PATENT DOCUMENTS

KR    10-1524308 B1    5/2015
KR    10-1706915 B1    2/2017
(Continued)

OTHER PUBLICATIONS

Written Opinion (PCT/ISA/237) issued by the International Searching Authority in corresponding International Application No. PCT/KR2019/001364, dated May 17, 2019.
(Continued)

*Primary Examiner* — Laurence J Lee
(74) *Attorney, Agent, or Firm* — Sughrue Mion, PLLC

(57) ABSTRACT

A display panel includes a driving circuit layer disposed on a glass that includes a first driving circuit and a second driving circuit, and an inorganic light emitting device mounted on the driving circuit layer to be electrically connected to the first driving circuit. The inorganic light emitting device includes a sub pixel of the display panel. The first driving circuit is located in an area where the inorganic light emitting device is mounted, while the second driving circuit is arranged in an area excluding an area in which the first driving circuit is arranged in the driving circuit layer. The second driving circuit generates a control signal for driving the first driving circuit and provide the generated control signal to the first driving circuit.

12 Claims, 19 Drawing Sheets

(52) U.S. Cl.
CPC ......... *G09G 3/2014* (2013.01); *H01L 27/156* (2013.01); *G09G 2300/043* (2013.01); *G09G 2300/0426* (2013.01); *G09G 2300/0452* (2013.01); *G09G 2310/08* (2013.01); *G09G 2320/0633* (2013.01); *G09G 2320/0666* (2013.01)

(56) References Cited

U.S. PATENT DOCUMENTS

| | | |
|---|---|---|
| 9,553,577 B2 | 1/2017 | Xiao |
| 9,632,611 B1 | 4/2017 | Xiao et al. |
| 2008/0174544 A1 | 7/2008 | Ueda et al. |
| 2009/0115703 A1 | 5/2009 | Cok |
| 2011/0279444 A1 | 11/2011 | Chung et al. |
| 2018/0068618 A1 | 3/2018 | Lin et al. |
| 2018/0151132 A1 | 5/2018 | Lee et al. |
| 2018/0239477 A1* | 8/2018 | Yang .................... G06F 3/0412 |

FOREIGN PATENT DOCUMENTS

| | | |
|---|---|---|
| KR | 10-2017-0080935 A | 7/2017 |
| KR | 10-2017-0118467 A | 10/2017 |
| KR | 10-1845002 B1 | 4/2018 |
| WO | 2010132552 A1 | 11/2010 |
| WO | 2016196390 A1 | 12/2016 |

OTHER PUBLICATIONS

International Search Report (PCT/ISA/210), issued by International Searching Authority in corresponding International Application No. PCT/KR2019/001364, dated May 17, 2019.

* cited by examiner

1000

DISPLAY PANEL INCLUDING INORGANIC LIGHT EMITTING DEVICE AND DRIVING CIRCUIT

CROSS-REFERENCE TO RELATED APPLICATIONS

This application is based on and claims priority under 35 U.S.C. § 119 to Korean Patent Application No. 10-2018-0063604, filed on Jun. 1, 2018, and Korean Patent Application No. 10-2018-0097404, filed on Aug. 21, 2018, in the Korean Intellectual Property Office, the disclosures of which are incorporated by reference herein in their entirety.

BACKGROUND

1. Field

The disclosure relates to a display panel. More particularly, the disclosure relates to a display panel in which light emitting devices are included in a pixel.

2. Description of Related Art

In related art, a display panel driving an inorganic light emitting device (LED) (hereinafter referred to as "LED") such as a red LED, a green LED, and a blue LED, as a sub pixel expresses a grayscale or gradation of sub pixels by means of an amplitude of a driving current.

In this case, a wavelength as well as the grayscale of a light emitted is shifted together according to an amplitude of the driving current, and thereby a color reproducibility of an image is reduced. FIG. 1 illustrates a wavelength shift according to a magnitude (or amplitude) of a driving current flowing through a blue LED, a green LED, and a red LED.

The above information is presented as background information only to assist with an understanding of the present disclosure. No determination has been made, and no assertion is made, as to whether any of the above might be applicable as prior art with regard to the present disclosure.

SUMMARY

Provided is a display panel including a driving circuit to control an LED which is an inorganic light emitting device mounted on a glass substrate to be stably operated.

Further, provided is a display panel including a driving circuit appropriate for a high-density integrated circuit by optimizing a design of a driving circuit driving an LED which is an inorganic light emitting device mounted on a glass substrate.

Further still, provided is a display panel that improves color reproducibility to an input image signal through an LED which is an inorganic light emitting device mounted on a glass substrate, and a display apparatus including the display panel.

In accordance with an aspect of the disclosure, a display panel includes a driving circuit layer disposed on a glass, the driving circuit layer comprising a first driving circuit and a second driving circuit; and an inorganic light emitting device mounted on the driving circuit layer and electrically connected to the first driving circuit, the inorganic light emitting device comprising a sub pixel of the display panel, wherein the first driving circuit includes a pulse amplitude modulation (PAM) driving circuit configured to control an amplitude of a driving current provided to the inorganic light emitting device; and a pulse width modulation (PWM) driving circuit configured to control a light emitting duration of the inorganic light emitting device, wherein the first driving circuit is provided a first area of the driving circuit layer and the second driving circuit is provided in a second area of the driving circuit layer that is different than and excludes the first area, and wherein the second driving circuit is configured to generate a control signal for driving the first driving circuit and provide the generated control signal to the first driving circuit.

The display panel may further include a plurality of pixels arranged in a matrix, each pixel from among the plurality of pixels comprising an R sub pixel comprising a red (R) inorganic light emitting device, a G sub pixel comprising a green (G) inorganic light emitting device, and a B sub pixel comprising a blue (B) inorganic light emitting device, and a plurality of first driving circuits, wherein each sub pixel from among the R, G and B sub pixels corresponds to a respective first driving circuit from among the plurality of first driving circuits.

A data voltage applied to each respective first driving circuit from among the plurality of first driving circuits to set an amplitude of the driving current may be corrected according to a deviation of the respective driving circuit, and wherein each respective first driving circuit from among the plurality of first driving circuits comprises a plurality of transistors configured to correct a deviation of pulse width of the driving current caused by the deviation of the respective first driving circuit.

Each respective first driving circuit from among the plurality of first driving circuits may include a first transistor connected to a data line and a current source, the first transistor being configured to provide a current flowing through the current source to a corresponding inorganic light emitting device based on a signal supplied by the data line, wherein the PAM driving circuit comprises a second transistor which is connected to the data line, wherein the PAM driving circuit is configured to perform a PAM control for the corresponding inorganic light emitting device according to an amplitude setup voltage input via the second transistor, the amplitude setup voltage being corrected based on the current flowing through the current source to the corresponding inorganic light emitting device, wherein the PWM driving circuit comprises a third transistor which is connected to the data line, and wherein the PWM driving circuit is configured to perform a PWM control for the corresponding inorganic light emitting device based on a pulse width setup voltage input via the third transistor.

The second driving circuit may include a first driver configured to generate, for each image frame from among a plurality of image frames, a first control signal that turns on respective first transistors that correspond to pixels arranged in a first line from among a plurality of lines of the matrix, and wherein the first driver is configured to provide the generated first control signal to the respective first transistors corresponding to the pixels arranged in the first line.

The first driver may be configured to for a first image frame from among the plurality of image frames, generate the first control signal for turning on the respective first transistors corresponding to the pixels arranged in the first line; and for a second image frame, generate the first control signal for turning on respective first transistors corresponding to pixels arranged in a second line following the first line.

The first driver may include a first circuit for each line from among the plurality of lines of the matrix, wherein each respective first circuit is configured to generate the first control signal for a corresponding line from among the plurality of lines, wherein an output signal of each first circuit is input as a start signal of the first circuit for a following line.

The second driving circuit may include a second driver configured generate, for each image frame from among a plurality of image frames, second and third control signals that turn on respective second and third transistors that correspond to pixels arranged in a first line from among a plurality of lines of the matrix, and wherein the second driver is configured to provide the generated second and third control signals to the respective second and third transistors corresponding to the pixels arranged in the first line.

The second driver may be configured to generate and provide the third control signal sequentially for each line from among the plurality of lines of the matrix, and wherein the second driver is configured to, after generating and providing the third control signal, generate and provide the second control signal for each line from among the plurality of lines of the matrix.

The second driver may include two second circuits for each line from among the plurality of lines of the matrix, wherein, for each line from among the plurality of lines, one of the two respective second circuits is configured to generate the second control signal for the line, wherein, for each line from among the plurality of lines, the other of the two respective second circuits is configured to generate the third control signal for the line, wherein the respective second circuit for each line is configured to receive an output signal of a second circuit of a previous line as a start signal, and wherein an output signal of the respective second circuit for each line is input as a reset signal to the second circuit of the previous line.

The driving circuit layer may further include at least one of a MUX circuit configured to select one of the R, G and B sub pixels; an electro static discharge (ESD) circuit configured to discharge static electricity occurring in the display panel; a power circuit configured to supply driving power to the first and second driving circuits; and a clock provision circuit configured to provide a clock to drive the first and second driving circuits.

The inorganic light emitting device may include a micro-LED of a size less than or equal to 100 micrometers.

According to the various embodiments of the disclosure, a wavelength shift according to a grayscale of an inorganic light emitting device included in a display panel can be prevented. In addition, it is possible to correct a stain or color of the inorganic light emitting device included in the display panel. In addition, even in a case that a large-area tiled display panel is configured by combining modular display panels, a difference of brightness or color among the respective display panel modules can be corrected.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
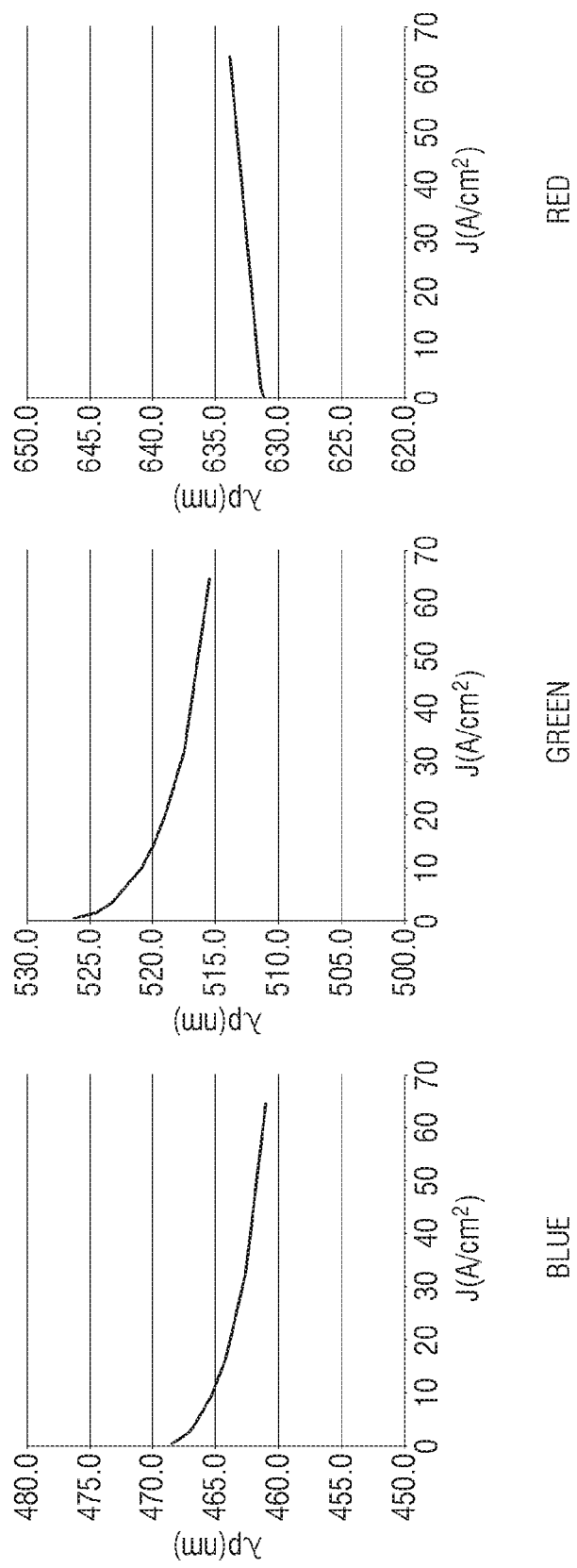
FIG. 1 is a diagram illustrating a wavelength shift according to a magnitude of a driving current flowing through a blue LED, a green LED, and a red LED.

In the following description, well-known functions or constructions are not described in detail since they would obscure the application with unnecessary detail. In addition, repeated description of the same element is omitted as much as possible.

In the drawings, the same reference numerals are used to represent the same elements.

The term "unit" as it appears in the disclosure does not itself have a distinct meaning or serve a particular purpose beyond the generally understood meaning of the term.

The terms used in the following description are provided to explain embodiments and are not intended to limit the scope. It is to be understood that the singular forms "a," "an," and "the" include plural referents unless the context clearly dictates otherwise.

Throughout this specification, it will be understood that the terms "comprise" and "include" and variations thereof, such as "comprising", "comprises", "including", and "includes", specify the presence of features, numbers, steps, operations, components, parts, or combinations thereof, described in the specification, but do not preclude the presence or addition of one or more other features, numbers, steps, operations, components, parts, or combinations thereof.

In the description, the terms "first, second, and so forth" are used to describe diverse elements regardless of their order and/or importance and to discriminate one element from other elements, but are not limited to the corresponding elements.

If it is described that a certain element (e.g., first element) is "operatively or communicatively coupled with/to" or is "connected to" another element (e.g., second element), it should be understood that the certain element may be connected to the other element directly or through still another element (e.g., third element). When it is mentioned that one element (e.g., first element) is "directly coupled" with or "directly connected to" another element (e.g., second element), it may be understood that there is no element (e.g., third element) present between the element and the other element.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Unless indicated otherwise, it is to be understood that all the terms used in the disclosure including technical and scientific terms have the same meanings as understood by those having ordinary skill in the art.

Hereinafter, the present disclosure will be described in detail with reference to the accompanying drawings.

Figure 2A:
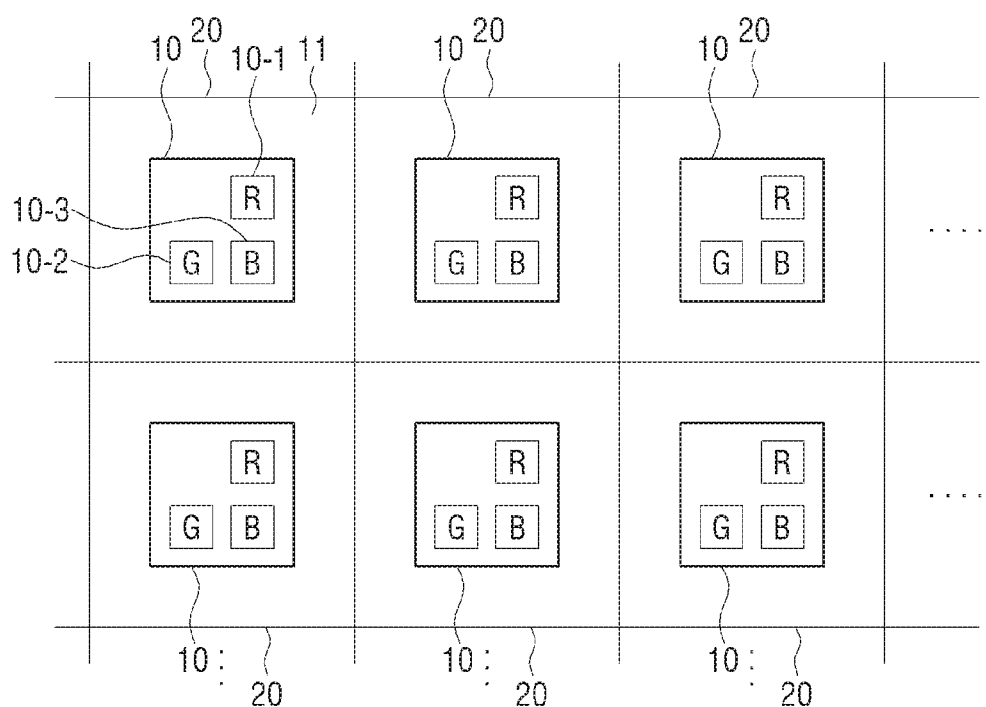
FIG. 2A is a diagram illustrating a pixel structure of a display panel, according to an embodiment.

FIG. 2A is a diagram illustrating a pixel structure of a display panel 1000, according to an embodiment. As illustrated in FIG. 2A, the display panel 1000 may include a plurality of pixels 10 which are arranged in a matrix form.

The respective pixels 10 may include a plurality of sub-pixels 10-1, 10-2 and 10-3. For example, one pixel 10 included in the display panel 1000 may include sub-pixels of three types: a red (R) sub-pixel 10-1, a green (G) sub-pixel 10-2, and a blue (B) sub-pixel 10-3. That is, one set of R, G and B sub-pixels may constitute a unit pixel of the display panel 1000.

Referring to FIG. 2A, it may be understood that one pixel area 20 of the display panel 1000 may include an area occupied with pixels 10, and a remaining peripheral area 11.

The area 10 occupied with pixels 10 may include the R, G and B sub-pixels 10-1, 10-2, and 10-3. The R sub-pixel 10-1 may include an R light emitting device and a first driving circuit for driving the R light emitting device. The G sub-pixel 10-2 may include a G light emitting device and a first driving circuit for driving the G light emitting device. The B sub-pixel 10-3 may include a B light emitting device and a first driving circuit for driving the B light emitting device. Referring to FIG. 2A, it may be understood that the sub-pixels 10-1, 10-2, and 10-3 in the one pixel 10 are arranged in an L shape. The left and right sides of the L shape may be reversed.

The remaining area 11 peripheral to the pixel 10 may include various circuits comprising a second driving circuit for driving the first driving circuit according to an embodiment. A specific description regarding this will be explained below.

Figure 2B:
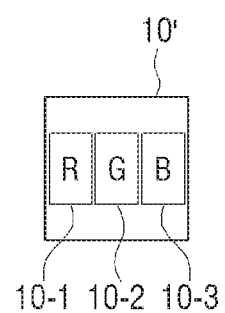
FIG. 2B is a diagram illustrating a sub-pixel structure, according to an embodiment.

FIG. 2B is a diagram illustrating a sub-pixel structure, according to another embodiment. As illustrated in FIG. 2B, the R, G and B sub-pixels 10-1, 10-2, and 10-3 may be arranged in a row. However, the disposition form of the sub-pixels is only an example, and a plurality of sub-pixels may be disposed in various forms in the respective pixels.

In the example described above, a pixel includes three types of sub-pixels, but is not limited thereto. For example, a pixel may be implemented with four types such as R, G, B and white (W), and according to an embodiment, a different number of pixels may be included in one pixel. Hereinafter, an example in which the pixel 10 includes a sub-pixel of three types such as R, G and B will be described for convenience of explanation.

Figure 3:
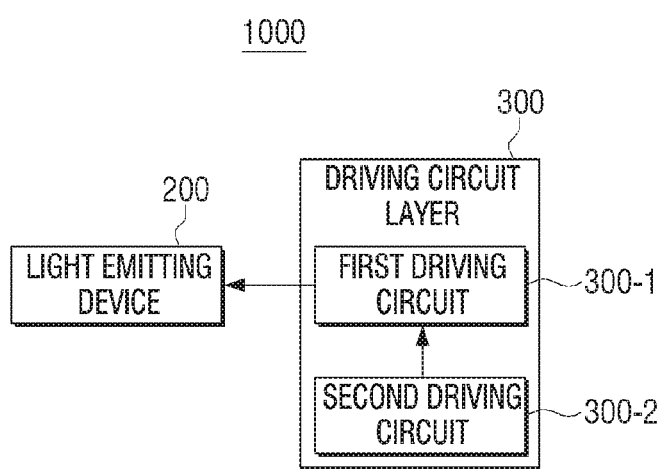
FIG. 3 is a block diagram illustrating a display panel, according to an embodiment.

FIG. 3 is a block diagram illustrating a display panel, according to an embodiment. Referring to FIG. 3, the display panel 1000 may include a driving circuit layer 300 and a light emitting device 200 (or light emitting diode). In the display panel 1000, as will be described later, a driving circuit layer 300 including a first driving circuit 300-1 and a second driving circuit 300-2 may be disposed on a glass 100, and the light emitting device 200 may be arranged on the driving circuit layer 300.

The light emitting device 200 may be included in the sub-pixels 10-1, 10-2, and 10-3 of the display panel 1000, and may emit light according to driving of the driving circuit 300. The light emitting device 200 may be of a plurality of types according to a color of light emitted. For example, a red (R) light emitting device emits red light, a green (G) light emitting device emits green light, and a blue (B) light emitting device emits blue light.

As described above with reference to FIG. 2A, a type of sub-pixel may be determined according to a type of the light emitting device 200 included in the sub-pixel. That is, the R light emitting device may be included in the R sub-pixel 10-1. The G light emitting device may be included in the G sub-pixel 10-2. The B light emitting device may be included in the B sub-pixel 10-3.

The light emitting device 200 may be an inorganic light emitting device (or inorganic light emitting diode) fabricated using an inorganic material which is different from an organic light emitting device (OLED) (or organic light emitting diode) fabricated using an organic material. Hereinafter, the term "LED" refers to an inorganic light emitting device which is distinguished from the OLED.

According to an embodiment, the inorganic light emitting device may be a micro light emitting diode (micro-LED). The micro LED refers to a subminiature inorganic light emitting diode of a size less than or equal to 100 micrometers (μm) self-illuminating without a backlight or a color filter.

The driving circuit layer 300 may include various circuits for driving the light emitting device 200. For example, a first driving circuit 300-1 for driving the light emitting device 200 and a second driving circuit 300-2 for driving the first driving circuit 300-1 may be included in the driving circuit layer 300.

For example, the first driving circuit 300-1 may drive the light emitting device 200 and express a grayscale (or gradation) for each sub-pixel. As described above, each one of the sub-pixels may include a light emitting device, and thus, unlike a liquid crystal display (LCD) panel using a plurality of LEDs emitting light in a single color as a backlight, the first driving circuit 300-1 may drive the light emitting device 200 such that the grayscale for each one of the sub-pixels is expressed individually.

To this end, the respective sub-pixels included in the display panel 1000 may be implemented as the light emitting device 200 and the first driving circuit 300-1 for driving the light emitting device 200. That is, the first driving circuit 300-1 for driving the respective light emitting devices 200 may be present in the driving circuit layer 300 for each sub-pixel.

According to an embodiment, the first driving circuit 300-1 may drive the light emitting device 200 according to a pulse amplitude modulation (PAM) and/or a pulse width modulation (PWM). That is, the first driving circuit 300-1 may control an amplitude and pulse width of a driving current driving the light emitting device 200 together, and provide, to the light emitting device 200, the driving circuit of which the amplitude and pulse width are controlled together.

The amplitude and pulse width of the driving current being controlled "together" does not mean that the amplitude and pulse width of the driving current are controlled simultaneously in time, but means that the PAM drive method and the PWM drive method are employed together to express the grayscale.

The PWM drive method is a method of expressing the grayscale according to a duration of light emission of the light emitting device 200. Accordingly, in a case that the light emitting device 200 is driven using the PWM method, even if the driving current has the same amplitude, it is possible to express various grayscales by adjusting the pulse width of the driving current to control the duration of light emission of the light emitting device 200. Accordingly, it is possible to resolve the problem that occurs in a case in which an LED is driven using the PAM method alone, namely, that a wavelength shift of light emitted by an LED (in particular, a micro-LED) may occur as the grayscale is adjusted.

To this end, the first driving circuit 300-1 may include a current source, a PAM driving circuit and a PWM driving circuit for each sub pixel, which will be described in greater detail below.

The second driving circuit 300-2 may be a driving circuit for driving the first driving circuit 300-1. That is, the second driving circuit 300-2 may generate a control signal for an operation of the first driving circuit 300-1 and provide the generated control signal to the first driving circuit 300-1.

Figure 7:
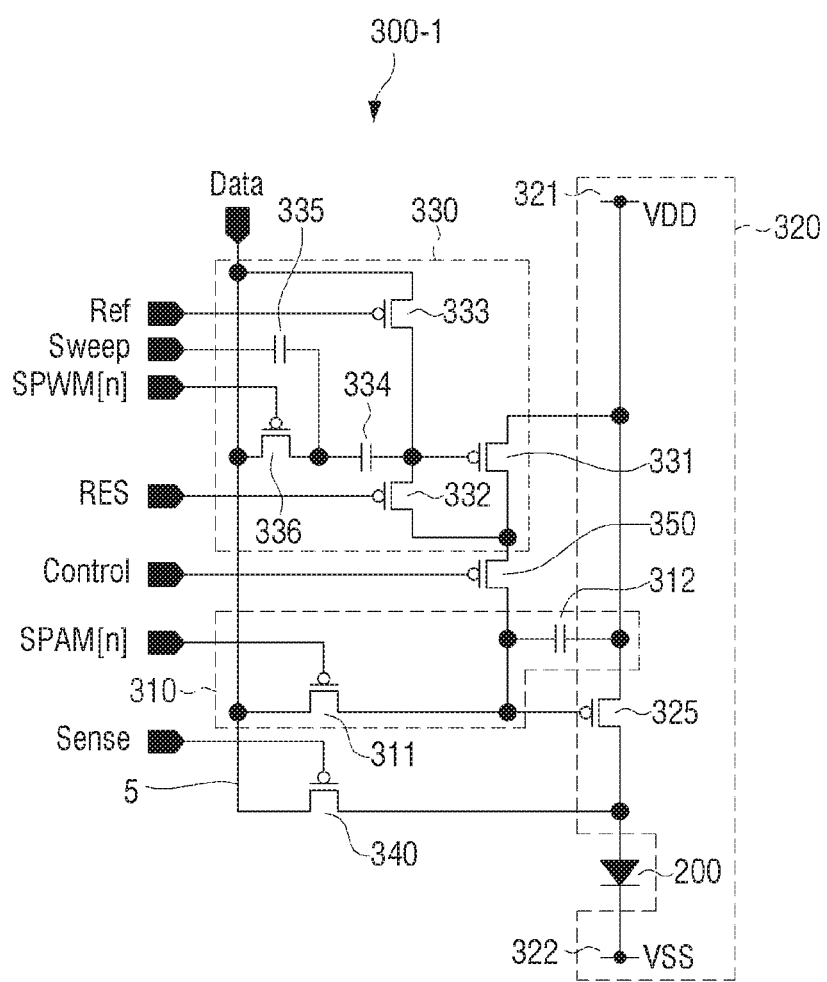
FIG. 7 is a circuit diagram illustrating a first driving circuit in detail, according to an embodiment.

For example, the second driving circuit 300-2 may generate control signals for respectively driving a PAM driving circuit and PWM driving circuit included in the first driving circuit 300-1, and provide the respective control signals to the PAM driving circuit and the PWM driving circuit. In addition, the second driving circuit 300-2 may, as illustrated in FIG. 7, generate a control signal for controlling a turn-on and turn-off of the first transistor 340 for providing a current flowing through a current source 320 included in the first driving circuit 300-1 to the outside to be sensed, and provide the generated control signal to the first transistor 340.

Here, the second driving circuit 300-2 may drive pixels of a display panel arranged in a matrix form line by line. That is, the second driving circuit 300-2 may drive the first driving circuits 300-1 included in the display panel 1000 by driving the first driving circuits 300-1 included in sub pixels of one line of the matrix and subsequently driving the first driving circuits 300-1 included in sub pixels of the next line.

As described above, the second driving circuit 300-2 may drive a plurality of pixels (or sub pixels) by the horizontal line (or row) of the matrix, and thus may be referred to as a "gate driver". However, the element is not limited by the name thereof, and depending on the function, for example, a part of the second driving circuit 300-2 for generating control signals for driving the PWM driving circuit and the PAM driving circuit may be referred to as a PWM driver and a PAM driver, and a part of the second driving circuit 300-2 for generating a control signal for turning on and off the first transistor 340 may be referred to as a sense driver.

Figure 4A:
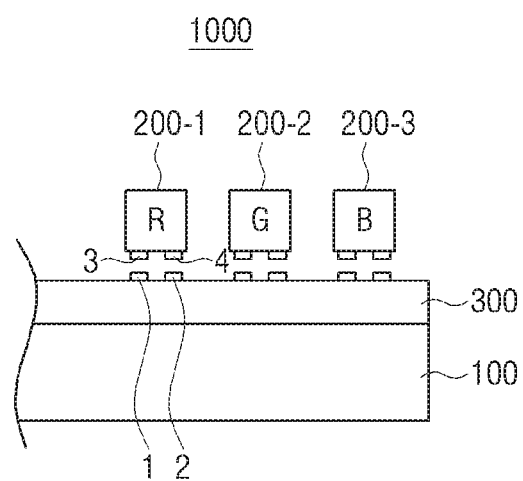
FIG. 4A is a block diagram illustrating a display panel, according to an embodiment.

FIG. 4A is a cross-sectional diagram of a display panel, according to an embodiment. With reference to FIG. 4A, only one pixel included in the display panel 1000 is described for convenience of explanation.

Referring to FIG. 4A, the driving circuit layer 300 may be disposed (or arranged) on a glass 100, and the respective light emitting devices R, G and B 200-1, 200-2, and 200-3 may be arranged (or mounted) on the driving circuit layer 300 and included in the respective sub pixels 10-1, 10-2, and 10-3.

As described above, the display panel 1000 in which the driving circuit layer 300 and the light emitting device layers 200-1, 200-2, and 200-3 are disposed on the glass 100 may be referred to as a display panel of a chip on glass (COG) type. The display panel of the COG type is different from a display panel of a chip on board (COB) type in which a driving circuit and a light emitting device layer are disposed on a substrate such as a synthetic resin and the like. The driving circuit layer 300 may be implemented as a thin film transistor (TFT) and form a TFT layer. In this case, the TFT may be a low temperature poly silicon (LTPS) TFT, but is not limited thereto. The driving circuit layer 300 disposed on the glass 100 and the glass 100 may be referred to as a TFT panel or a glass substrate. A type or characteristic of the glass 100 included in the glass substrate is not related to the embodiments so that an explanation thereof is omitted.

The first driving circuit 300-1 for driving the respective light emitting devices 200-1, 200-2, and 200-3 may be present on the driving circuit layer 300 for each of the light emitting devices 200-1, 200-2, and 200-3. Accordingly, the light emitting devices R, G and B 200-1, 200-2, and 200-3 may be arranged on the driving circuit layer 300 so that they are respectively electrically connected to the corresponding first driving circuit 300-1.

As illustrated in FIG. 4A, the R light emitting device 200-1 may be mounted or arranged so that an anode electrode 3 and a cathode electrode 4 of the R light emitting device 200-1 are respectively connected to an anode electrode 1 and cathode electrode 2 disposed on the first driving circuit 300-1 for driving the R light emitting device 200-1, and the same applies to the G light emitting device 200-2 and the B light emitting device 200-3. According to an embodiment, any one of the anode electrode 1 and the cathode electrode 2 may be implemented as a common electrode.

With reference to FIG. 4A, an example in which the light emitting devices 200-1, 200-2, and 200-3 are micro-LEDs of a flip chip type is described. However, the example is not limited thereto, and according to an embodiment, the light emitting devices 200-1, 200-2, and 200-3 may be micro-LEDs of a lateral type or micro-LEDs of a vertical type.

For example, as described above, a second driving circuit 300-2 for driving the first driving circuit 300-1 may be further included in the driving circuit layer 300. The specific description of the second driving circuit 300-2 will be described in detail later.

Figure 4B:
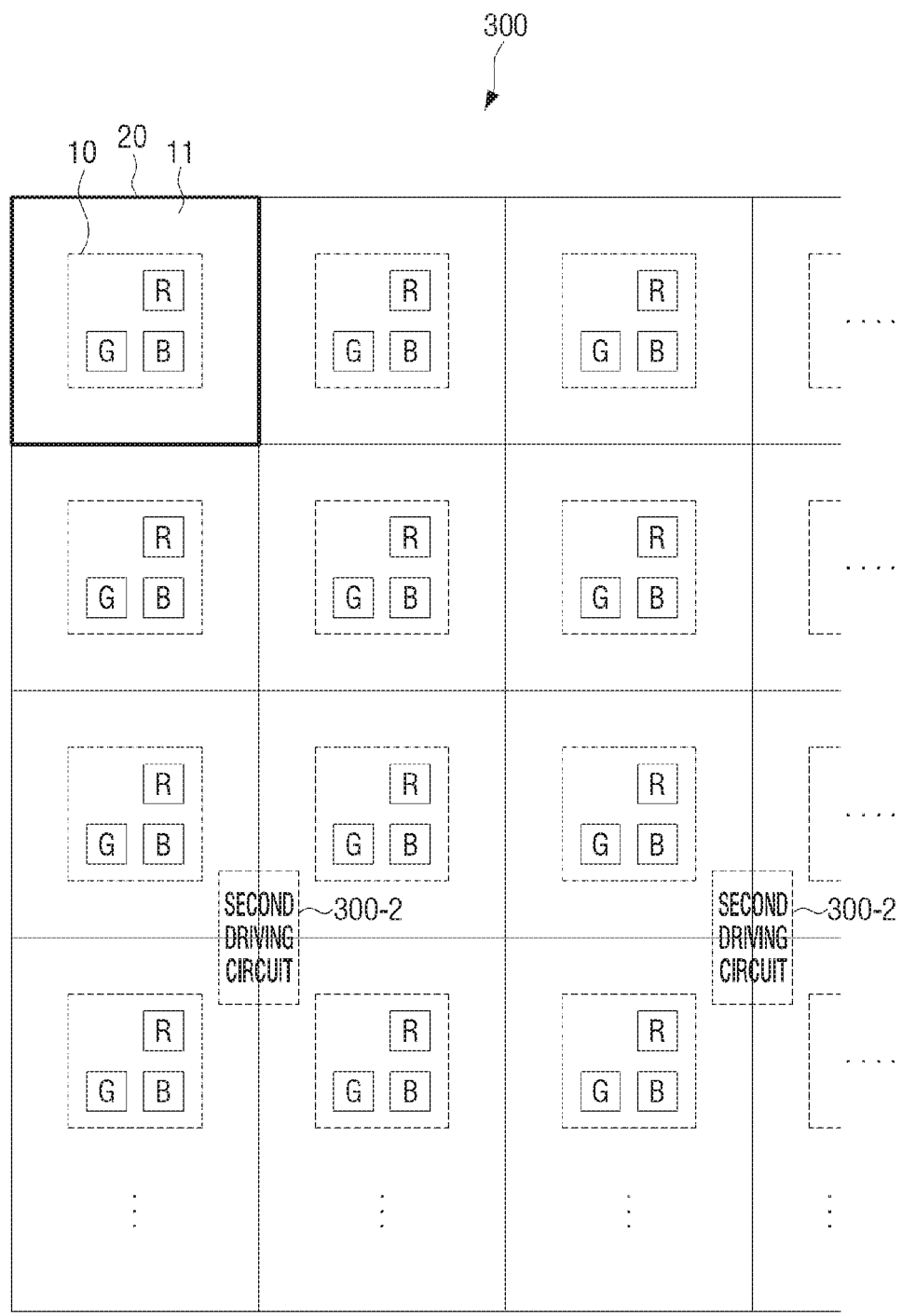
FIG. 4B is a plan view of a driving circuit layer, according to an embodiment.

FIG. 4B is a plan view of a driving circuit layer 300, according to an embodiment. For example, FIG. 4B illustrates an example in which the first driving circuit 300-1 and the second driving circuit 300-2 are arranged in the driving circuit layer 300 of the display panel 1000.

Referring to FIG. 4B, an entire pixel area 20 occupied by one pixel in the driving circuit layer 300 may include an area 10 in which three first driving circuits 300-1 for driving the respective R, G and B sub pixels are arranged, and a peripheral remaining area 11. According to an embodiment, a size of the area 10 occupied by the first driving circuit 300-1 for the respective R, G and B sub pixels may be a size of about a quarter of the entire pixel area 20, but is not limited thereto.

As described above, one pixel area 20 may include the remaining area 11, and so may the other pixels. That is, according to an embodiment, many spaces other than an area occupied with the first driving circuit 300-1 are present in the driving circuit layer 300, and thus, the second driving circuit 300-2 implemented as a TFT may be included in the remaining area 11 of the driving circuit layer 300 as illustrated in FIG. 4B. The location, size and number of the second driving circuit 300-2 illustrated in FIG. 4B are only a non-limiting example.

According to an embodiment, the display panel 1000 may further include various circuits, such as a multiplexer (MUX) circuit for selecting any one of the plurality of sub pixels 10-1, 10-2, and 10-3 included in the pixel 10, an electro static discharge (ESD) circuit for preventing a static electricity generated on the display panel 1000, a power circuit for supplying power to the driving circuit 300, a clock circuit for providing a clock to operate the driving circuit 300, and a data driver (or source driver) for providing a data voltage (for example, an amplitude setup voltage, a pulse width setup voltage, etc.) to the respective pixels or sub pixels of the display panel 1000 arranged in a matrix form.

Figure 5A:
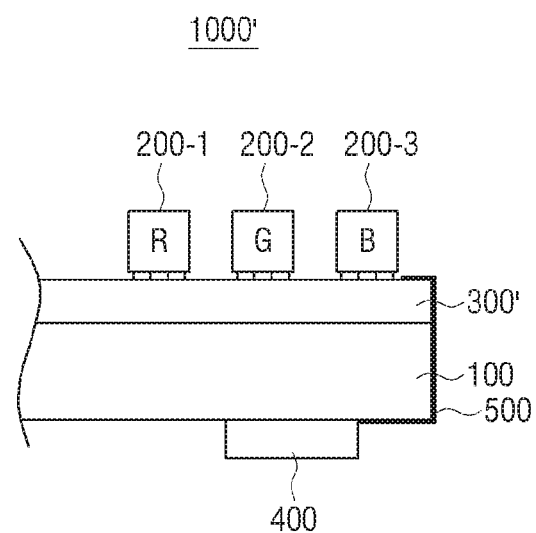
FIG. 5A is a cross-sectional view of a display panel, according to an embodiment.
Figure 5B:
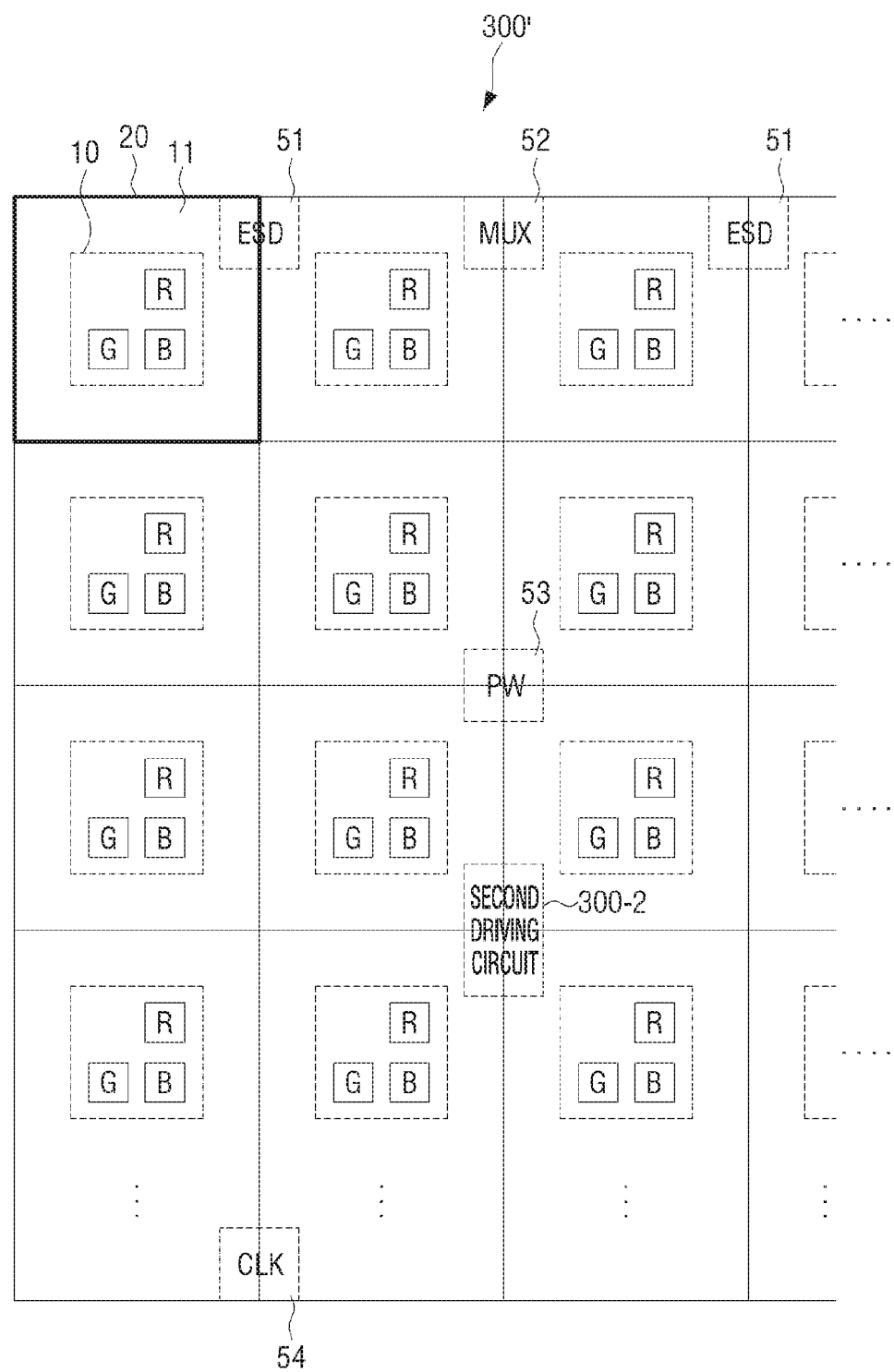
FIG. 5B is a plan view of a driving circuit layer, according to an embodiment.

An example display panel further comprising these various circuits will be described in greater detail below with reference to FIGS. 5A and 5B. In FIGS. 5A and 5B, the same elements described above will not be described in detail.

FIG. 5A is a cross-sectional view of a display panel 1000', according to another embodiment. As illustrated in FIG. 5A, the display panel 1000' may include a driving circuit layer 300' disposed on the glass 100 and including a first driving circuit 300-1 and a second driving circuit 300-2, a light emitting device 200-1, 200-2, and 200-3 disposed on the driving circuit layer 300' and included in a sub pixel of the display panel 1000', various circuits 400 for driving the driving circuit 300 such as the MUX circuit, ESD circuit, power circuit, clock circuit, and data driver described above, and a connection cable 500 electrically connecting the driving circuit layer 300' with the various circuits 400 described above.

The driving circuit layer 300' may include the first and second driving circuits 300-1 and 300-2, and may be disposed on a first surface of the glass 100. The various circuits 400 described above may be disposed or arranged on a second surface of the glass 100 as a semiconductor integrated circuit (IC) separate from the driving circuit layer 300'.

According to an embodiment, the display panel 1000' may include the connection cable 500 in an edge area of a TFT substrate, and electrically connect the driving circuit layer 300' disposed on a first surface of the glass 100 with the various circuits 400 disposed on a second surface of the glass 100 via the connection cable 500.

The connection cable 500 is disposed in the edge area of the TFT substrate because otherwise, in a case that a hole penetrating the glass is made and circuits arranged on the opposite sides of the glass are connected to each other via the hole, a crack may occur on the glass due to a difference of temperature between a fabrication process of the TFT substrate and a process of filling the hole with conductive materials.

In the example described above, the various circuits described above are, as in the reference numeral 400, separately disposed on the opposite side of the glass 100 surface on which the driving circuit layer 300' is disposed. However, the example is not limited thereto. That is, all or some of the various circuits may be included in the driving circuit layer 300' and disposed.

For example, all the various circuits described above may be disposed on the driving circuit layer 300', in which case, it is not necessary that a circuit is additionally arranged on the other surface of the glass 100 and accordingly, the connection cable 500 of FIG. 5A connecting front and rear surfaces of the glass 100 would not be necessary, either.

As another example, the MUX circuit, the ESD circuit, the power circuit, and the clock circuit may be implemented as a TFT and included in the driving circuit layer 300', and the data driver circuit is arranged on the other side of the glass 100. FIG. 5B is a diagram provided to explain such an embodiment.

FIG. 5B is a plan view of a driving circuit layer 300', according to another embodiment. In detail, FIG. 5B illustrates a disposition of various circuits included in the driving circuit layer 300' of the display panel 1000'.

As described with reference to FIG. 4B, many spaces other than an area 10 occupied with the first driving circuit 300-1 are present in the driving circuit layer 300, and thus, not only the second driving circuit 300-2 but also the ESD circuit 51, the MUX circuit 52, the power circuit 53 (PW) and the clock circuit 54 (CLK) may be implemented as a TFT and included in the remaining area 11 of the driving circuit layer 300' as illustrated in FIG. 5B. In this case, the data driver circuit may be arranged on the other surface of the glass 100 as in the reference numeral 400 of FIG. 5A. The location, size and number of the respective ESD circuit 51, the MUX circuit 52, the power circuit 53, and the clock provision circuit 54 are only a non-limiting example.

In addition, an embodiment in which various circuits are arranged on both sides as being divided based on the glass 100 is not limited to the example of FIG. 5B, and at least one circuit from among the ESD circuit 51, MUX circuit 52, power circuit 53, and clock circuit 54 of FIG. 5B may be arranged on the other surface of the glass 100 as in the reference numeral 400 of FIG. 5A.

In the example described above, the second driving circuit 300-2 is included in the driving circuit layer 300 and 300'. However, the example is not limited thereto, and according to an embodiment, the second driving circuit 300-2 may be arranged on a second surface of the glass 100 as in the reference numeral 400 of FIG. 5A.

Figure 6:
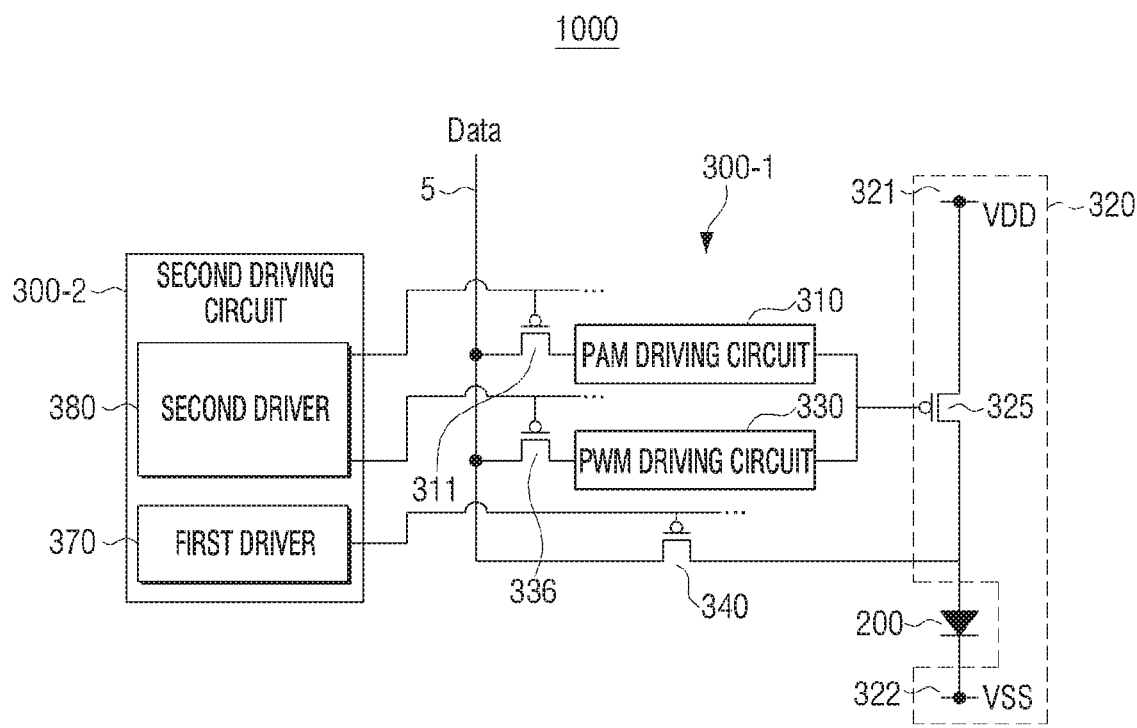
FIG. 6 is a diagram illustrating a configuration of one sub pixel included in a display panel, according to an embodiment.

FIG. 6 is a diagram illustrating a configuration of one sub pixel included in a display panel 1000 and/or 1000', according to an embodiment. Referring to FIG. 6, the display panel 1000 and/or 1000' may include a light emitting device 200, a first driving circuit 300-1 and a second driving circuit 300-2.

The first driving circuit 300-1 may include a pulse amplitude modulation (PAM) driving circuit 310, a pulse width modulation (PWM) driving circuit 330, a current source 320, and a first transistor 340.

As described above, the first driving circuit 300-1 may be provided for each sub pixel, and the one first driving circuit 300-1 drives one sub pixel. In this case, the PAM driving circuit 310 may be referred to as a PAM pixel circuit, and the PWM driving circuit 330 may be referred to as a PWM pixel circuit. For convenience of explanation, the terms "first driving circuit 300-1" "PWM driving circuit 310" and "PWM driving circuit 330" are used to describe an embodiment.

The current source 320 may provide a driving current to the light emitting device 200. For example, the current source 320 may include a driving transistor 325 which is connected to in between the driving voltage terminal 321 and the ground voltage terminal 322 of the current source 320.

The PAM driving circuit 310 may control amplitude of the driving circuit provided to the light emitting device 200. For example, the PAM driving circuit 310 may include a second transistor 311 connected to the data line 5, and perform a PAM control for the light emitting device 200 according to an amplitude setup voltage input via the second transistor 311 and corrected based on a sensed current flowing through the light emitting device 200.

To this end, the first driving circuit 300-1 may include a first transistor 340.

For example, the first transistor 340 may be connected to the data line 5 and the current source 320 (more specifically, a drain terminal of the driving transistor 325), and provide, via the data line 5, a current flowing through the current source (more specifically, the driving transistor 325) to the light emitting device 200.

In this case, the current transferred to the data line 5 may be detected by a current sensor outside the first driving circuit 300-1, and a processor or timing controller (TCON) outside the first driving circuit 300-1 may, as described above, correct an amplitude setup voltage based on the current sensed as described above, and apply the corrected amplitude setup voltage to the PAM driving circuit 310.

Accordingly, a deviation of amplitude of a driving current (more specifically, a deviation of threshold voltage among the driving transistors 325 included in each of the first driving circuits 300-1) caused by a deviation between a plurality of first driving circuits 300-1 included in the sub pixels of the display panel 1000 can be compensated.

As described above, a method of compensating a threshold voltage of the driving transistor 325 by sensing a current flowing through the driving transistor 325 and correcting an amplitude setup voltage may be referred to "external compensation" or "threshold voltage external compensation (Vth external compensation)".

The PWM driving circuit 330 may include a third transistor 336 connected to the data line 5, and perform a PWM control for the light emitting device 200 based on a pulse width setup voltage input via the third transistor 336.

Figure 8:
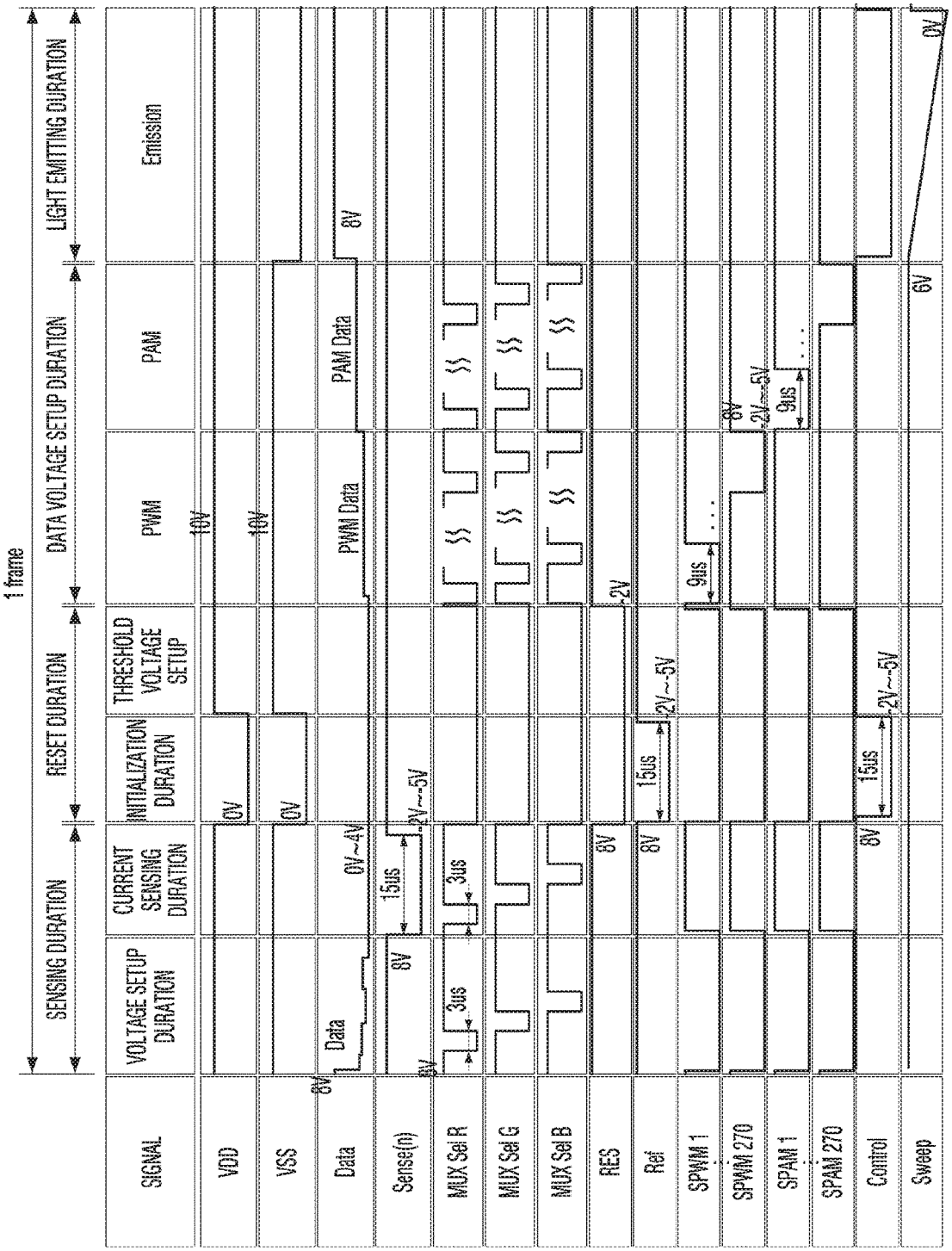
FIG. 8 is a timing diagram of various signals for driving a first driving circuit included in a display panel according to an embodiment.

As illustrated in FIGS. 7 and 8, the PWM driving circuit 330 may include two transistors connected to each other using a so-called "diode connected method". For example, the PWM driving circuit 330 may include a fourth transistor 331, and a fifth transistor 332 connected to a gate terminal of the fourth transistor 331 and a drain terminal of the fourth transistor 331.

Accordingly, in the operation process of the PWM driving circuit 330, a voltage that accounts for a threshold voltage of the fourth transistor 331 may be applied to the gate terminal of the fourth transistor 331.

Accordingly, a deviation of pulse width of a driving current (more specifically, a deviation of threshold voltages among the fourth transistors 331 in included in each of the first driving circuits 300-1) caused by a deviation between a plurality of first driving circuits 300-1 included in the sub pixels of the display panel 1000 can be compensated.

As described above, a method of compensating a threshold voltage of a fourth transistor 331 through a connection structure of the fourth transistor 331 and a fifth transistor 332 in the PWM driving circuit 330 may be referred to as "internal compensation" or "threshold voltage internal compensation (Vth internal compensation)".

For convenience of explanation, FIG. 6 illustrates only one driving circuit 300-1 to explain a connection relationship between the second driving circuit 300-2 and the first driving circuit 300-1. However, the second driving circuit 300-2 may, as described above, control a plurality of pixels included in the display panel 1000 and/or 1000' by the line, and thus may be connected to the first driving circuits of all pixels included in the corresponding line.

According to an embodiment, the first driver 370 of the second driving circuit 300-2 may, for each image frame, generate a first control signal for turning on the first transistors 340 included in a plurality of driving circuits included in one line from among a plurality of horizontal lines of the display panel 1000 and/or 1000', and provide the generated first control signal to the first transistors 340 of the one line.

To this end, the first driver 370 may, for one image frame, generate a control signal for turning on the first transistors 340 included in one line of the matrix of pixels, and for the next image frame, generate a control signal for turning on the first transistors 300-1 included in a line following the one line.

The second driver 380 may generate second and third control signals for turning on second transistors 311 and third transistors 336 of the plurality of first driving circuits 300-1 included in a plurality of horizontal lines of the display panel 1000 and/or 1000' for one image frame line by line, and provide the generated second and third control signals to the second transistors 311 and the third transistors 336 of the respective lines.

The second driver 380 may, for one image frame, generate a third control signal for sequentially turning on the third transistors 336 line by line and provide the generated third control signal to the third transistors of the respective lines, and then generate a second control signal for sequentially turning on the second transistors 311 line by line and provide the generated second control signal to the second transistors 311 of the respective lines.

An operation of the first driving circuit 300-1 according to the various embodiments described above will be described in more detail with reference to FIGS. 7 to 9.

FIG. 7 is a detailed circuit diagram of a first driving circuit 300-1, according to an embodiment. Referring to FIG. 7, the first driving circuit 300-1 may include a PAM driving circuit 310, a current source 320, and a PWM driving circuit 330. The first driving circuit 300-1 may include a driving transistor 325, a first transistor 340, a second transistor 311, a third transistor 336, a fourth transistor 331, a fifth transistor 332, a sixth transistor 333, and a seventh transistor 350. The first driving circuit 300-1 may include a first capacitor 312, a second capacitor 334, and a third capacitor 335.

The first driving circuit 300-1 illustrated in FIG. 7 is a circuit for driving one light emitting device 200, and as described above, a plurality of pixels provided in the display panel 1000 and/or 1000' includes a plurality of light emitting devices, and thus a plurality of first driving circuits 300-1 as illustrated in FIG. 7 may be provided in the display panel 1000 and/or 1000'.

The PAM driving circuit 310 may apply a voltage input through the data line 5 to a gate terminal of the driving transistor 325 of the current source 320. To this end, the PAM driving circuit 310 may include a second transistor 311 of which a source terminal is connected to the data line 5 and a drain terminal is connected to a gate terminal of the driving transistor 325, and a first capacitor 312 of which a first terminal is connected to a source terminal of the driving transistor 325 and a second terminal is commonly connected to the gate terminal of the driving transistor 325 and a drain terminal of a second transistor 311.

Accordingly, the PAM driving circuit 310 may, when an amplitude setup voltage (PAM data) is input through the data line 5 while the second transistor 311 is turned on according to a control signal (SPAM(n)), charge the input amplitude setup voltage in the first capacitor 312, and apply the voltage charged in the first capacitor 312 to the gate terminal of the driving transistor 325.

As illustrated in FIG. 7, the source terminal of the driving transistor 325 may be commonly connected to the first terminal of the first capacitor 312 and a driving voltage terminal 321 of the first driving circuit 300-1, the drain terminal of the driving transistor 325 may be connected to an anode terminal of the light emitting device 200, and the cathode terminal of the light emitting device 200 may be connected to a ground voltage terminal 322 of the first driving circuit 300-1.

The current source 320 may, in a state that a driving voltage (VDD) is applied to the driving voltage terminal 321 and the voltage charged in the first capacitor 312 is applied to the gate terminal of the driving transistor 325, when a voltage of the ground voltage terminal 322 becomes a ground voltage (VSS), provide, to the light emitting device 200, a driving current having an amplitude that corresponds to an amplitude of the voltage charged in the first capacitor 312.

In the seventh transistor 350, the drain terminal may be connected to the gate terminal of the driving transistor 325, the source terminal may be commonly connected to the fourth transistor 331 and a drain terminal of the fifth transistor 332, and the PAM driving circuit 310 and the PWM driving circuit 330 may be electrically connected to or separated from each other according to a control signal (Control) applied to a gate terminal of the seventh transistor 350.

The PWM driving circuit 330 may, when a pulse width setup voltage determining a pulse width of a driving current is applied through the data line 5, control a voltage of the gate terminal of the driving transistor 325 on the basis of the pulse width setup voltage.

To this end, the PWM driving circuit 330 may include a fourth transistor 331, a fifth transistor 332 connected to a gate terminal of the fourth transistor 331 and a drain terminal of the fourth transistor 331, a sixth transistor 333 including a source terminal connected to the data line 5, and a drain terminal commonly connected to the gate terminal of the fourth transistor 331 and a source terminal of the fifth transistor 332, a second capacitor 334 including a first terminal commonly connected to the gate terminal of the fourth transistor 331, the source terminal of the fifth transistor 332 and the drain terminal of the sixth transistor 333, a third capacitor 335 including a first terminal receiving input of a sweep signal, and a second terminal is connected to a second terminal of the second capacitor 334, and a third transistor 336 including a source terminal connected to the data line 5, and a drain terminal commonly connected to the second terminal of the second capacitor 334 and the second terminal of the third capacitor 335.

In this case, the seventh transistor 350 may be connected to the gate terminal of the driving transistor 325 and the drain terminal of the fourth transistor 331.

While the fifth transistor 332 is turned on, a gate terminal voltage of the fourth transistor 331 may be a voltage which is based on a threshold voltage of the fourth transistor 331.

Thereafter, while the third transistor 336 is turned on according to a control signal (SPWM(n)), when a pulse width setup voltage (PWM data) is input through the data line 5, the gate terminal voltage of the fourth transistor 331 may be a voltage which is based on the threshold voltage and pulse width setup voltage of the fourth transistor 331. Thereafter, when a linearly changing sweep signal is input through one terminal of the third capacitor 335, the gate terminal voltage of the fourth transistor 331 may be linearly changed according to the sweep signal.

When the linearly-changed gate terminal voltage of the fourth transistor 331 reaches the threshold voltage of the fourth transistor 331, the fourth transistor 331 may be turned on and a driving voltage (VDD) applied to the source terminal of the fourth transistor 331 may be applied to the gate terminal of the driving transistor 325 through the drain terminal of the fourth transistor 331 (in this case, it is necessary that the seventh transistor 350 is also turned on according to the Control signal). Accordingly, the driving transistor 325 may be turned off and the driving current flowing through the light emitting device 200 may be stopped, and thereby a light emitting duration of the light emitting device 200 can be controlled.

In this case, an inclination of linear change of the sweep signal may be the same for all first driving circuits 300 included in a display panel 1000 and/or 1000', and according to an input of the sweep signal, the gate terminal voltage of the fourth transistor 331 may be linearly changed from a voltage which is based on the threshold voltage and pulse width setup voltage of the fourth transistor 331.

Accordingly, a time required for the gate terminal voltage of the fourth transistor 331 to reach the threshold voltage of the fourth transistor 331 after the sweep signal is applied differs according to an amplitude of the pulse width setup voltage, and thus the PWM driving circuit 330 may express a variety of grayscales according to the amplitude of the pulse width setup voltage.

In addition, a driving time of a driving current (that is, a pulse width of a driving current) flowing through the driving transistor 325 is a period from when the gate terminal voltage of the fourth transistor 331 is linearly changed in response to the input sweep signal until it reaches the threshold voltage of the fourth transistor 331, and thus is properly determined regardless of the threshold voltage of the fourth transistor 331.

Accordingly, according to an embodiment, it is possible to compensate a deviation of threshold voltages among the fourth transistors 331 included in a plurality of first driving circuits 300-1 included in a plurality of pixels of the display panel 1000 and/or 1000'.

As illustrated in FIG. 7, it may be understood that the display panel 1000 and/or 1000' according to various embodiments is a display panel of an active matrix (AM) drive method where the first driving circuit 300-1 for driving the respective sub pixels is implemented as a TFT.

FIG. 8 is a timing diagram of various signals for driving a first driving circuit 300-1 included in a display panel. The numerical figures of various voltages and times illustrated in FIG. 8 are only an example, and are not limited to the corresponding values.

Referring to FIG. 8, the first driving circuit 300-1 may be, while one image frame is displayed, driven in the order of a sensing duration, a reset duration, a data voltage setup duration, and a light emitting duration.

The sensing duration is a duration for sensing a current flowing through the driving transistor 325. The sensing duration may include a voltage setup duration for applying a particular voltage to the gate terminal of the driving transistor 325, and a current sensing duration for sensing a current flowing through the driving transistor 325 corresponding to the particular voltage.

The particular voltage is a voltage distinct from an amplitude setup voltage determining amplitude of a driving current provided to the light emitting device 200. The particular voltage is a voltage for correcting a deviation of threshold voltages between the driving transistors 325 included in the plurality of pixel driving circuits according to sensing of the current flowing through the driving transistor 325 corresponding to the particular voltage.

In detail, when the second transistor 311 is turned on according to the control signal (SPAM(n)) within the voltage setup duration, the particular voltage is charged in the first capacitor 312 through the data line 5. Thereafter, when the first transistor 340 is turned on according to the control signal (Sense) within the current sensing duration, a current corresponding to the particular voltage flowing through the driving transistor 325 may be transferred to the data line 5 through the first transistor 340.

The particular voltage may be variously set according to embodiments. For example, a particular voltage for sensing a driving voltage (that is, typical current) when the display panel is normally driven and a particular voltage for sensing a driving current (that is, peak current) when the display panel is driven at a maximum brightness may be different from each other, and as necessary, a particular voltage of different amplitudes may be applied through the data line 5 during the voltage setup duration.

As described above, the current flowing through the data line 5 may be sensed by a current sensor outside of the first driving circuit 300-1. Accordingly, according to an embodiment, a processor or timing controller (TCON) outside of the first driving circuit 300-1 may correct an amplitude setup voltage for each of the first driving circuits 300-1 on the basis of a current sensed as described above, and apply the corrected amplitude setup voltage to the PAM driving circuit 310 during the data voltage setup duration, and thereby a deviation of threshold voltage between the driving transistors 325 included in each of the plurality of first driving circuits 300-1 included in the display panel can be compensated.

For example, if a particular voltage applied to the gate terminal of the driving transistor 325 during the voltage setup duration is a and an amplitude of the sensed current is x, the processor or the timing controller (TCON) may identify an amplitude of current (for example, y) corresponding to the voltage a from a pre-stored table with which a particular voltage and an amplitude of current are mapped.

Accordingly, if the sensed current x is greater than y, that is, if the sensed current is greater than a current according to the pre-stored table, the processor or the timing controller (TCON) may correct an amplitude setup voltage to be applied to the driving transistor 325 during the actual data voltage setup duration afterwards to be less than an amplitude setup voltage that would originally have been applied without the correction. If x is less than y, the amplitude setup voltage may be corrected to have an even higher value and applied to the PAM driving circuit 310. Accordingly, it is possible to compensate the deviation of threshold voltage between the driving transistors 325 included in each of the plurality of first driving circuits 300-1 included in the plurality of pixels of the display panel.

The reset duration is a period for setting the gate terminal voltage of the fourth transistor 331 to a voltage based on the threshold voltage of the fourth transistor 331. The reset duration may include an initialization duration for setting the gate terminal voltage of the fourth transistor 331 of the first driving circuit 300-1 and/or the gate terminal voltage of the driving transistor 325 to a preset reference voltage, and a threshold voltage setup duration for setting the gate terminal voltage of the fourth transistor 331 to a voltage based on the threshold voltage of the fourth transistor 331.

When the reset duration is started, the fifth transistor 332 may be turned on according to a control signal (RES). While the fifth transistor 332 is turned on, the sixth transistor 333 may be turned on or off according to a control signal (Ref). That is, the sixth transistor 333 may be, as illustrated in FIG. 8, turned on and then turned off during an initialization duration.

When the sixth transistor 333 is turned on, a preset reference voltage (in the example of FIG. 8, a predetermined voltage in the range of 0V to 4V) may be applied to the gate terminal of the fourth transistor 331 through the data line 5, and thus the gate terminal voltage of the fourth transistor 331 may be set to the reference voltage while the sixth transistor 333 is turned on.

Thereafter, when a threshold voltage setup duration is started, the sixth transistor 333 may be turned off, and accordingly, the gate terminal voltage of the fourth transistor 331 may be set to a voltage corresponding to the sum of the driving voltage (VDD) and the threshold voltage (Vth) of the fourth threshold voltage 331.

Referring to FIG. 8, the seventh transistor 350 is turned on while the sixth transistor 333 is turned on according to the control signal (Control), and thus a reference voltage applied to the gate terminal of the fourth transistor 331 may be applied the same to the gate terminal of the driving transistor 325. That is, during the initialization duration, both the gate terminal voltage of the fourth transistor 331 and the gate terminal voltage of the driving transistor 325 may be set to a predetermined reference voltage (for example, 0V).

As described above, the gate terminal voltage of the fourth transistor 331 and the gate terminal voltage of the driving transistor 325 may be clearly set to a reference voltage prior to the threshold voltage setup duration, thereby preventing an inaccurate operation due to floating of the gate terminal voltage of the fourth threshold voltage 331.

The data voltage setup duration is a period for respectively applying a pulse width setup voltage (PWM data) and an amplitude setup voltage (PAM data) to the PWM driving circuit 330 and the PAM driving circuit 310.

For example, when the third transistor 336 is turned on according to the control signal (SPWM(n)) during the data voltage setup duration, a pulse width setup voltage is applied through the data line 5 to the gate terminal of the fourth transistor 331 through the second capacitor 334. Accordingly, the gate terminal voltage of the fourth transistor 331 may rise by a pulse width setup voltage (Vw), and the increased voltage may be maintained by the second capacitor 334.

When the second transistor 311 is turned on according to the control signal (SPAM(n)) during the data voltage setup duration, an amplitude setup voltage applied through the data line 5 may be charged in the first capacitor 312 and maintained. In this case, the amplitude setup voltage applied through the data line 5 may be a voltage which is corrected based on a current flowing through the driving transistor 325 sensed during the sensing duration.

In FIG. 8, PWM data, that is, a pulse width setup voltage is applied first and then, PAM data, that is, an amplitude setup voltage, is applied. However, the example is not limited thereto, and according to embodiments, the PWM data may be applied after the PAM data is applied.

The light emitting duration is a period for which the light emitting device 200 emits light according to a pulse width setup voltage and an amplitude setup voltage. As illustrated in FIG. 8, when a light emitting duration is started, a voltage of a ground voltage terminal 322 of the first driving circuit 300-1 may fall to a ground voltage (VSS, for example, 0V), and the driving transistor 325 may be accordingly turned on and a driving current of an amplitude corresponding to the amplitude setup voltage charged in the first capacitor 312 may be provided to the light emitting device 200. Accordingly, the light emitting device 200 initiates light emission.

When the light emitting duration is started, a sweep voltage may be applied to one terminal of the second capacitor 334 through the third capacitor 335, and thus the gate terminal voltage of the fourth transistor 331 connected to the other terminal of the second capacitor 334 may be linearly reduced from the maintained voltage (VDD+Vth+Vw) according to the sweep voltage.

When the gate terminal voltage of the fourth transistor 331 being linearly reduced reaches the threshold voltage Vth of the second transistor 331, the fourth transistor 331 may be turned on, and a driving voltage VDD may be applied to the gate terminal voltage of the driving transistor 325 via the seventh transistor 350. Accordingly, when the driving transistor 325 is turned off, the driving current may be blocked and the light emitting device 200 stops emitting light.

That is, the light emitting device 200 may emit light from a time when a light emitting duration is started until the gate terminal voltage of the fourth transistor 331 is linearly reduced according to a sweep voltage and reaches the threshold voltage Vth of the fourth transistor 331.

In addition, FIG. 8 illustrates an embodiment of the display panel 1000 and/or 1000' in which the plurality of pixels are configured as 270 horizontal lines. Accordingly, as illustrated in FIG. 8, control signals SPWM 1 to SPWM 270 and control signals SPAM 1 to SPAM 270 are respectively driven in sequence during the data voltage setup duration.

According to an embodiment, the R, G and B sub pixels included in the respective pixels of the display panel 1000 and/or 1000' may have a structure of being connected to one data line 5. The R, G and B sub pixels may respectively receive different data voltages applied through one data line 5 via a multiplexer (Mux) (MUX Sel R, MUX Sel G, and MUX Sel B).

That is, as illustrated in FIG. 8, the R, G and B sub pixels included in the respective pixels of the display panel 1000 and/or 1000' may be time-division driven (or, sequentially selected) through a MUX during the data voltage setup duration, and receive input of a pulse width setup voltage or amplitude setup voltage of different magnitudes from the data line 5.

This operation is applied in the same way during the sensing duration. As illustrated in FIG. 8, the R, G and B sub pixels included in the respective pixels of the display panel 1000 and/or 1000' may be sequentially selected through the Mux during the voltage setup duration and receive input of a particular voltage of different magnitudes from the data line 5. In this case, a particular voltage input to the respective R, G and B sub pixels may be a value which is theoretically or experimentally determined based on a type of a sub pixel. According to an embodiment, a particular voltage of different magnitudes may be input to the respective R, G and B sub pixels, or a particular voltage of the same magnitude may be input to the respective R, G and B sub pixels.

In addition, the display panel 1000 and/or 1000' may be driven in such a way that a current flowing through the driving transistor 325 of the pixel driving circuit corresponding to the R, G and B sub pixels during the sensing duration is sensed in different durations within the current sensing duration.

In this case, according to an embodiment, the display panel 1000 and/or 1000' may be driven to sense a current flowing through driving transistors 325 of a plurality of first driving circuits 300-1 included in a plurality of pixels included in one horizontal line (or one column) from among a plurality of pixels configured in a matrix form during the sensing duration.

That is, the display panel 1000 and/or 1000' may be driven to sense only a current flowing through the driving transistors 325 of the plurality of first driving circuits 300-1 included in the plurality of pixels arranged on one horizontal line, with respect to one image frame, without sensing the current flowing through the driving transistors 325 on the other horizontal lines with respect to the one image frame.

That is, the display panel 1000 and/or 1000' may be driven to sense a current flowing through the driving transistors 325 included in one horizontal line per image frame. In this case, the display panel 1000 and/or 1000' may be driven to sequentially shift a horizontal line for each image frame and sense a current flowing through the driving transistors 325 included in the corresponding line.

In general, a time for which one image frame is displayed is a very short period of time that a viewer cannot recognize with the naked eye, and thus, even if only one horizontal line of one image frame is sensed as described above, it may be sufficient to compensate a deviation of threshold voltage between the driving transistors 325.

However, the example is not limited thereto, and the display panel 1000 and/or 1000' may be driven to sense a current flowing through the driving transistors 325 included in two or more horizontal lines during the sensing duration for one image frame.

In the example described above, all transistors 325, 350, 311, 331, 332, 333, 336 and 340 included in the first driving circuit 300-1 are implemented as a P-channel metal oxide semiconductor field effect transistor (PMOSFET), but are not limited thereto. However, embodiments are not limited to any specific examples.

According to an embodiment, a first driving circuit of which all transistors are implemented as an N-channel metal oxide semiconductor field effect transistor (NMOSFET) may be implemented to perform the same operation as the first driving circuit 300-1 as described above. FIG. 9 illustrates a first driving circuit 900 in which all transistors included in a first driving circuit are as an n-type metal-oxide-semiconductor field-effect transistor (n-MOSFET).

Figure 9:
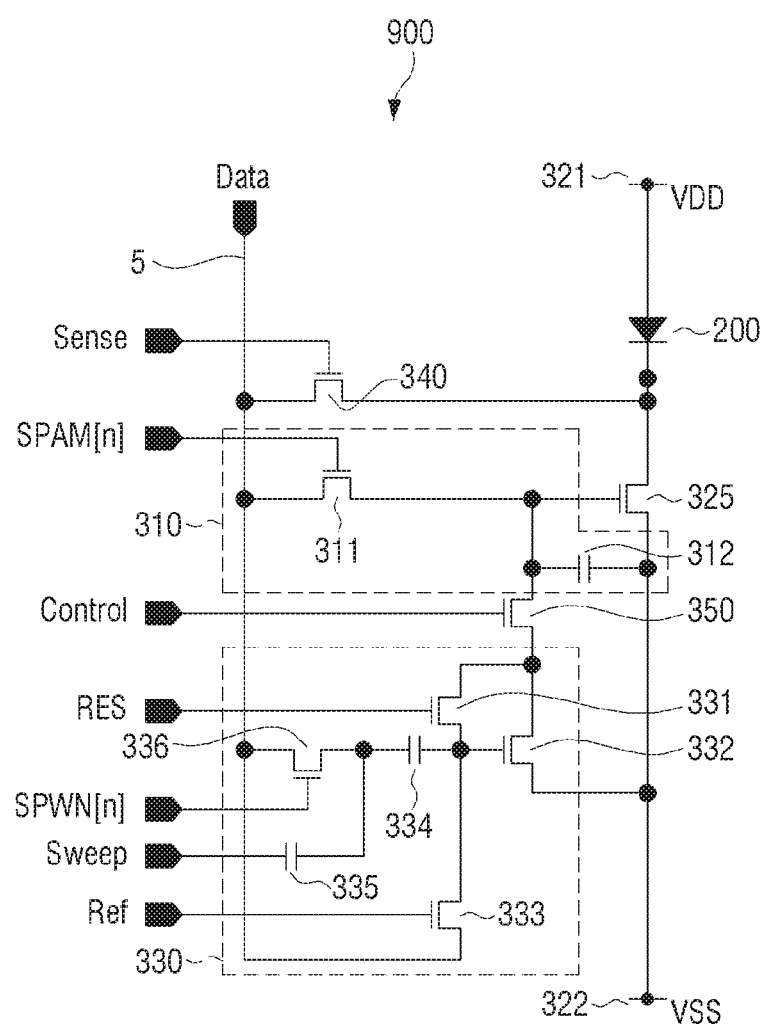
FIG. 9 is a circuit diagram of a first driving circuit in which all transistors included in a first driving circuit are as n-type metal-oxide-semiconductor field-effect transistor (n-MOSFET) according to an embodiment.

The first driving circuit 900 of FIG. 9 may perform the same operation as the first driving circuit 300-1 of FIG. 7 excluding a difference due to a type of transistor (for example, a difference of connection relationship between devices and a difference of polarity of various signals to be applied). Accordingly, in the first driving circuit 900 of FIG. 9, the same reference numeral is used for devices performing the same function as the devices included in the first driving circuit 300-1 of FIG. 7. The structure and operation of the first driving circuit 700 would be easily understood by those skilled in the art through the description shown above, and thus the redundant description will be omitted herein.

As described above, according to an embodiment, the display panel 1000 and/or 1000' may be driven to sense a current flowing through driving transistors included in a horizontal line that is sequentially changed for each image frame. To this end, as a horizontal line is sequentially changed per image frame, it is necessary to apply the control signal (Sense) to only the changed line during the sensing duration. FIG. 8 is a timing diagram regarding one frame, which illustrates an example in which a sense signal is applied once to one line during the sensing duration (in particular, current sensing duration).

In the display panel 1000 and/or 1000', to display one image frame, it is necessary to set an amplitude setup voltage and a pulse width setup voltage for all sub pixels of each pixel.

Accordingly, in the display panel 1000 and/or 1000', it is necessary to apply a pulse width setup voltage and an amplitude setup voltage to the PWM driving circuit 330 and the PAM driving circuit 310 while sequentially changing the entire horizontal lines for one image frame. In FIG. 8 in which signals are driven to display one image frame in a time sequence, control signals SPWM 1 to SPWM 270 and control signals SPAM 1 to SPAM 270 illustrate the embodiment described below.

According to various embodiments, the second driving circuit 300-2 may generate a control signal controlling, line by line, light emitting devices 200 included in the display panel 1000 and/or 1000' as described above, and provide the generated control signal to the display panel 1000 and/or 1000'.

The following will explain the structure and operation of the second driving circuit 300-2 in detail by referring to FIGS. 10A, 10B, 10C, 11A, 11B and 11C. The numerical figures of various voltages and times illustrated in FIGS. 10A, 10B, 10C, 11A, 11B and 11C are only an example, and are not limited to the corresponding values.

Figure 10A:
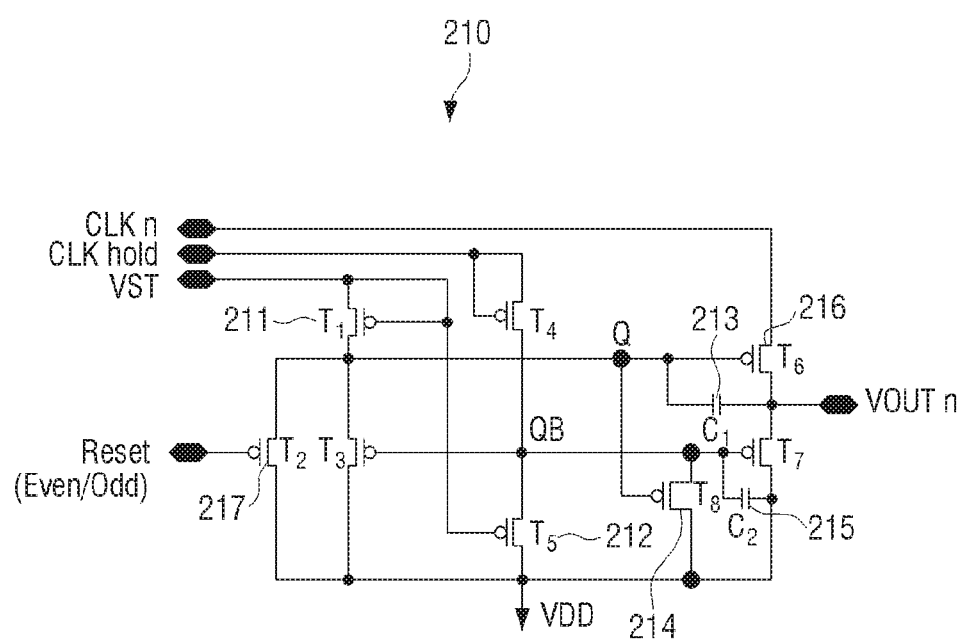
FIG. 10A is a diagram illustrating a structure and operation of a first driving circuit according to an embodiment.

FIG. 10A is a circuit diagram of a first circuit 210 included in a first driver 370, according to an embodiment. As described above, the display panel 1000 and/or 1000' may sequentially change horizontal lines per image frame, and a control signal (Sense) may be applied to the changed line.

Figure 10B:
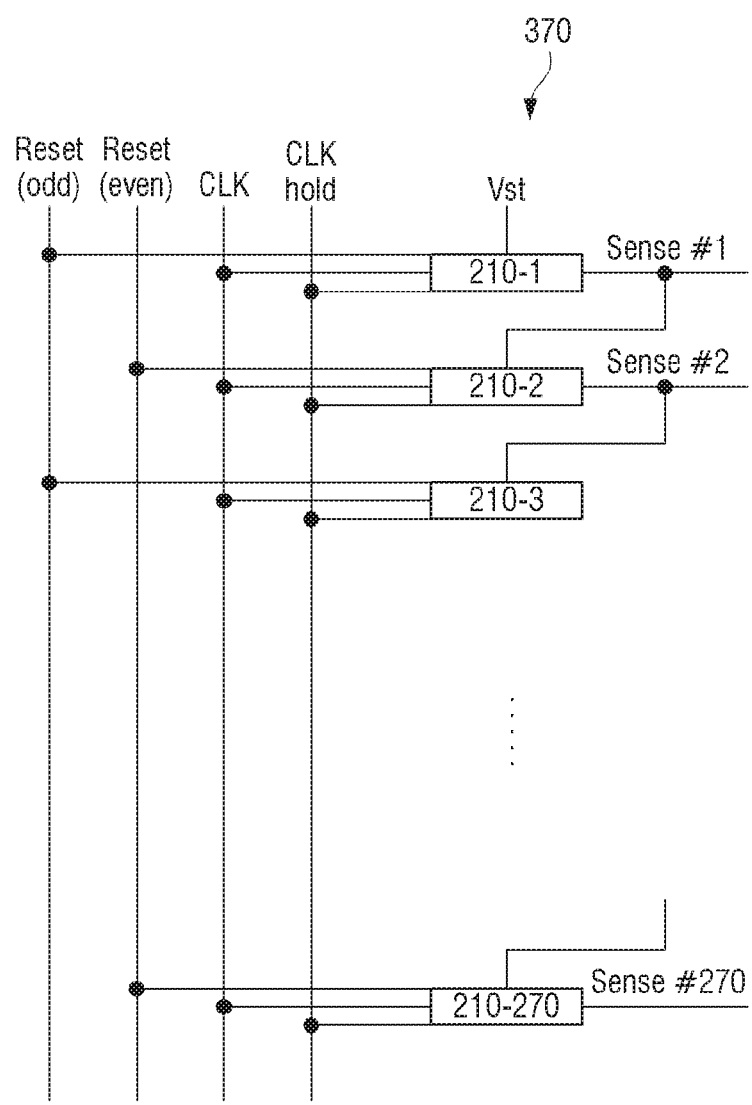
FIG. 10B is a diagram illustrating a structure and operation of a first driving circuit according to an embodiment.
Figure 10C:
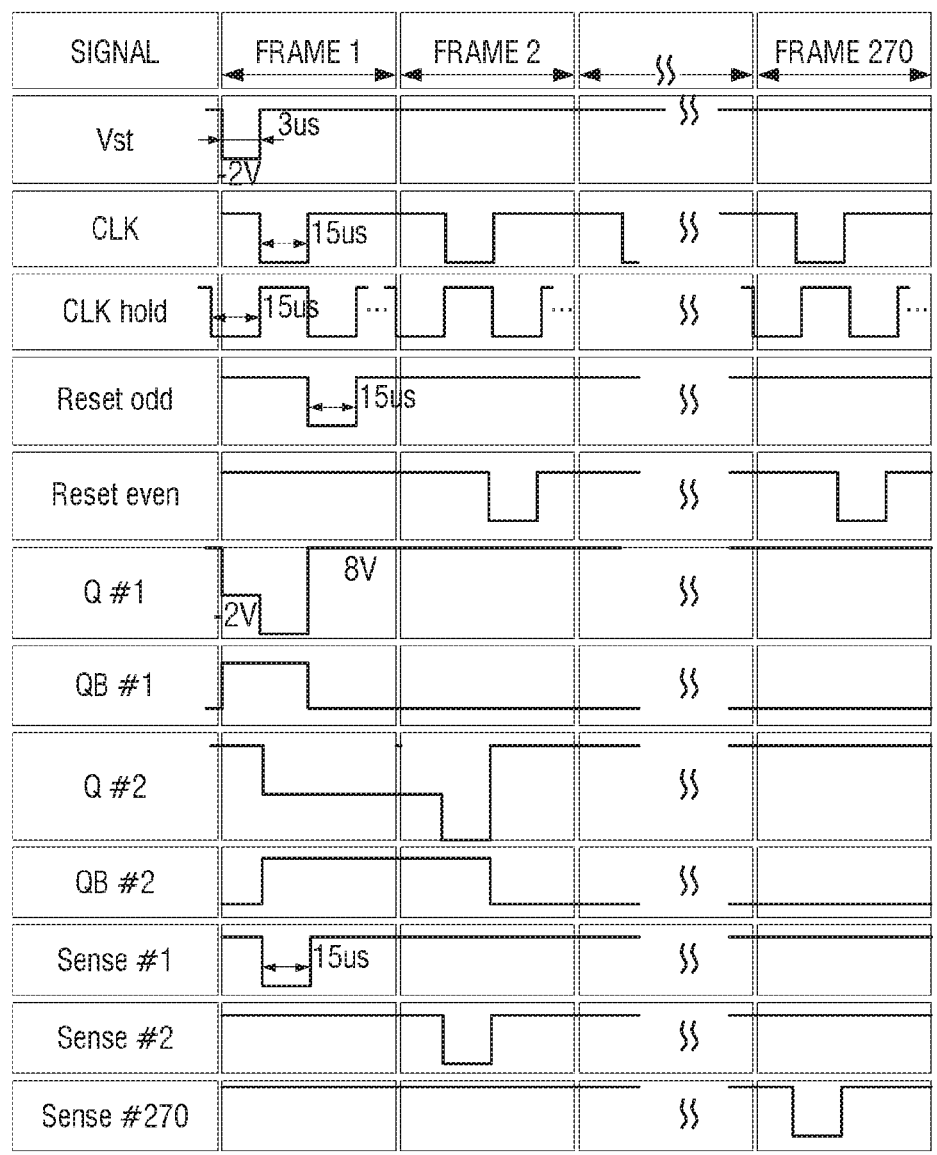
FIG. 10C is a diagram illustrating a structure and operation of a first driving circuit according to an embodiment.

To this end, first circuits 210-1 to 210-270 provided for each line may be connected to each other as illustrated in FIG. 10B. Referring to FIG. 10B, in a driver output signal (Sense) for one line, 270 first circuits 210-1 to 210-270 may be interconnected so that the driver output signal (Sense) is input as a start signal (Vst) of a driver for the line following the one line. Referring to FIG. 10C, the Sense signal may be output by changing lines once per frame.

A process of outputting one Sense control signal will be described below with reference to FIGS. 10A and 10C.

First, when a Vst signal is input, the transistor 211 is turned on and a Q terminal voltage becomes a low state, and accordingly the transistor 214 may be turned on and a QB terminal voltage becomes a high state (VDD). The low voltage may be charged in the capacitor 213.

Then, when a CLK signal becomes a low state, the Q terminal voltage may be bootstrapped and accordingly, the transistor 216 may be fully turned on and a Vout, that is, a Sense #1 signal, may be output.

Then, when a Reset signal is applied low, the transistor 217 may be turned on and the Q terminal voltage may become high and accordingly, the transistor 214 may be turned off.

In this case, a CLK hold signal is applied low, a QB voltage becomes low, is charged in the capacitor 215, and remains low according to the CLK hold signal because the transistor 214 is turned off and the connection with the VDD is released.

A time for which the QB terminal voltage remains low is a period from when the reset signal is applied until when the CLK low signal is applied to the first driving circuit 210-2.

The other operations would be obviously understood by those skilled in the art from a relationship between the structure of the circuit and a signal to be applied, and thus a further explanation will not be provided herein.

As described above, by connecting the first circuits 210-1 to 210-270 and applying a signal to the first circuits 210-1 to 210-270, the first driver 370 may generate a control signal (Sense) output by changing lines once per frame, and apply the generated control signal (Sense) to the first transistors 340 of the display panel 1000 and/or 1000'.

In FIG. 10A, input signals applied to the first circuit 210, such as CLK, CLK hold, VST, and Reset may be received as illustrated in FIG. 10C from an external processor or TCON.

Figure 11A:
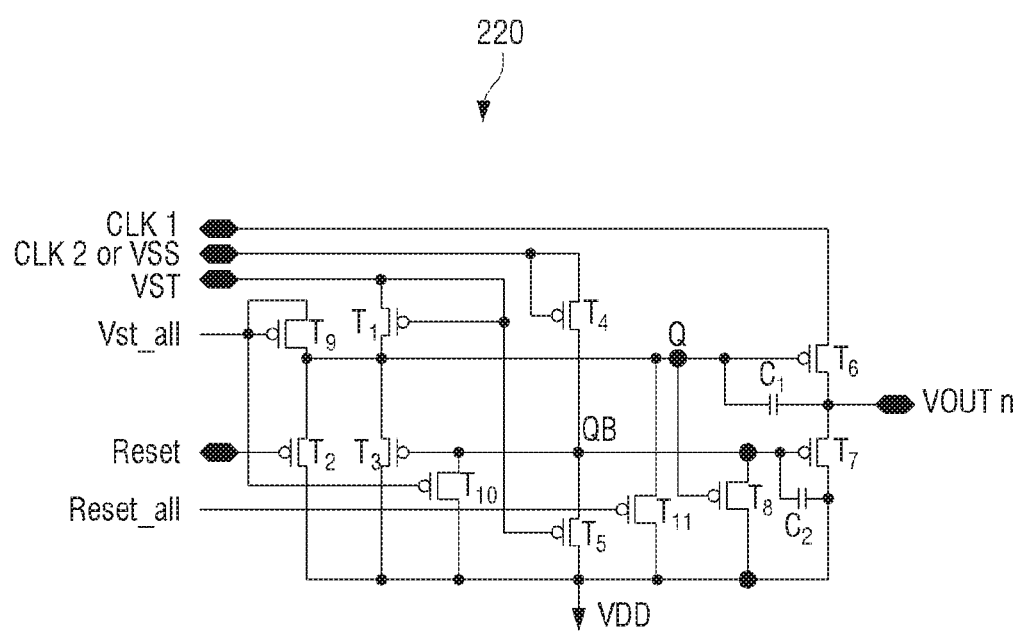
FIG. 11A is a diagram illustrating a structure and operation of a second driving circuit according to an embodiment.

FIG. 11A is a circuit diagram of a second circuit 220 included in a second driver 380, according to an embodiment. As described above, in the display panel 1000 and/or 1000', a pulse width setup voltage and an amplitude setup voltage may be respectively applied to the PWM driving circuit and the PAM driving circuit while sequentially changing the entire horizontal lines for one image frame.

Figure 11B:
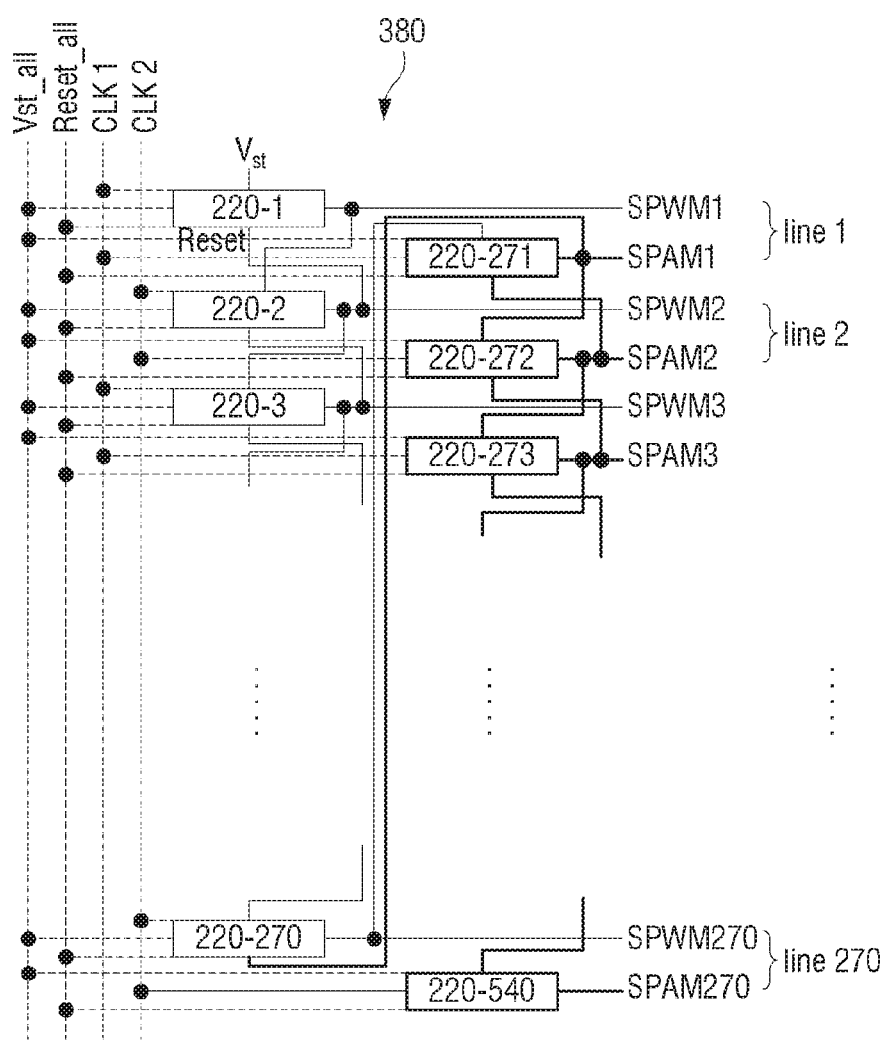
FIG. 11B is a diagram illustrating a structure and operation of a second driving circuit according to an embodiment.

To this end, for example, two circuit components 220 included in the second driver 380 may be arranged per line and may be connected to each other as illustrated in FIG. 11B. For example, as illustrated in FIG. 11B, two circuit components 220-1 and 220-270 may both be arranged in line 1.

Referring to FIG. 11B, one second circuit 220-2 included in the second driver 380 may receive an output signal of the second circuit 220-1 of the previous line as a start signal (Vst), and may be connected so that the output signal of the second circuit 220-2 is input as a reset signal (Reset) of the second circuit 220-1 of the previous line.

As illustrated in FIG. 11A, second circuit 220 may, as compared with the first circuit 210 of FIG. 10A, further include three transistors T9, T10 and T11 in relation to the control signals Vst_all (the entire start) and Reset_all (the entire reset), and may be identical except for the fact that the output signal Vout becomes a SPWM signal or a SPAM signal.

Figure 11C:
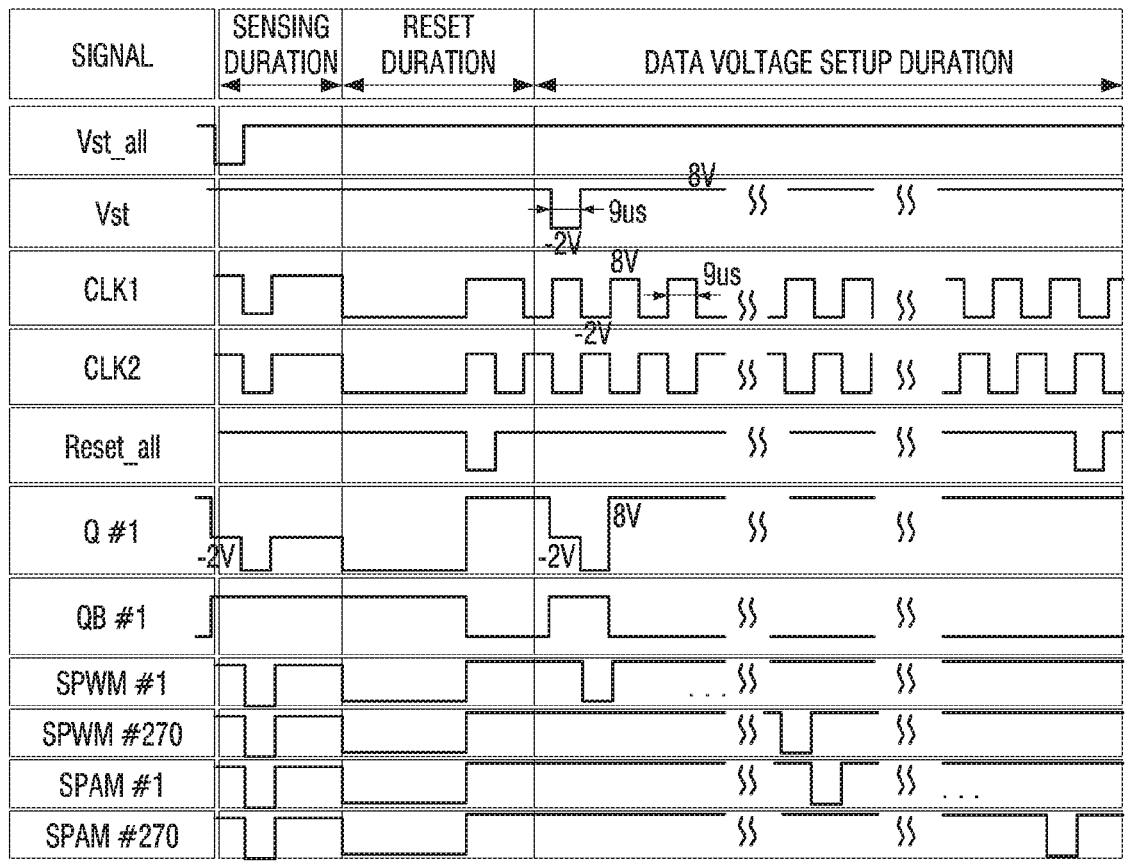
FIG. 11C is a diagram illustrating a structure and operation of a second driving circuit according to an embodiment.

Accordingly, those skilled in the art would have obviously understood the operation of the second circuit 220 through the description of operations of FIGS. 10A and 10C, the structure of the circuit component 220 of FIG. 11A, and the timing diagram of the signals illustrated in FIG. 11C. Accordingly, a further explanation will not be provided herein.

According to an embodiment, a ground voltage (VSS) may be connected to a CLK 2 terminal rather than inputting a CLK 2 signal to the CLK 2 terminal. In addition, control signals Vst_all, Vst, CLK1, CLK2, Reset_all, etc. applied to the second circuit 220 may be received as illustrated in FIG. 11C from an external processor or TCON.

For example, the timing diagram of FIG. 11C illustrates an example of a scan job of SPWM and SPAM lines when sub pixels (for example, R, G and B sub pixels) included in one pixel are not connected to each other via a multiplexer (MUX), that is, when the MUX is not used.

Accordingly, when the MUX is used, that is, when the R, G and B sub pixels are respectively driven through the MUX, according to an embodiment, the scan job of the SPWM and SPAM lines of FIG. 11C may be repeatedly carried out three times by the sub pixel.

Figure 12:
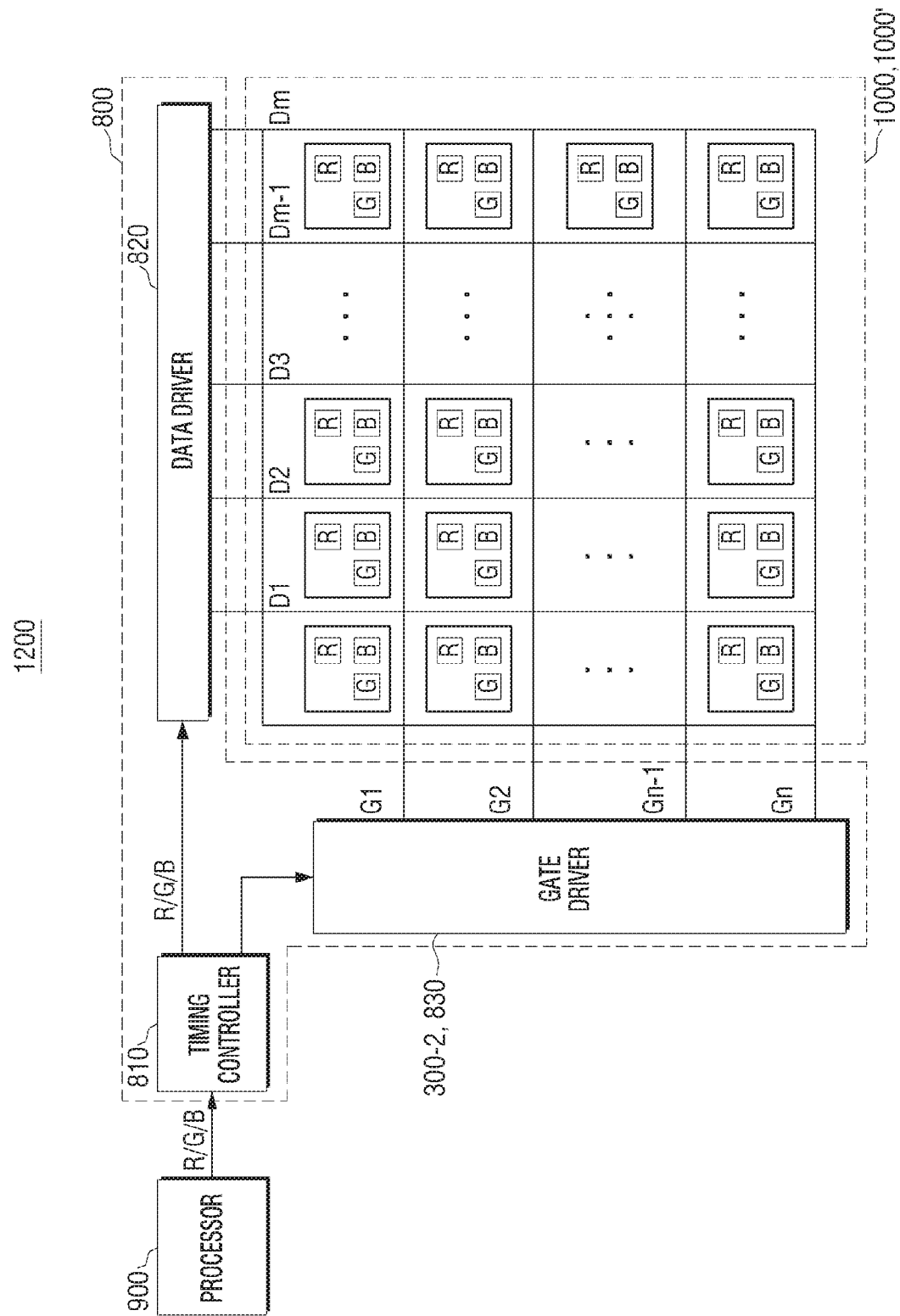
FIG. 12 is a diagram illustrating a configuration of a display apparatus, according to an embodiment.

FIG. 12 is a diagram illustrating a configuration of a display apparatus, according to an embodiment. Referring to FIG. 12, a display apparatus 1200 may include a display panel 1000 and/or 1000', a panel driver 800, and a processor 900.

The display panel 1000 and/or 1000' may include a plurality of light emitting devices 200 included in a plurality of sub pixels, and a plurality of first driving circuits 300-1 for driving the respective light emitting devices 200.

For example, the display panel 1000 and/or 1000' may be disposed such that gate lines G1 to Gn and data lines D1 to Dm intersect with each other, and the first driving circuit 300-1 may be disposed in an area in which the intersection is provided. For example, the plurality of first driving circuits 300-1 may be respectively configured such that adjacent R, G and B sub pixels form one pixel, but the example is not limited thereto.

FIG. 12, for convenience of illustration, illustrates one gate signal line G1 to Gn as a line for applying a control signal from the gate driver 830 (that is, the second driving circuit 300-2, hereinafter, in FIG. 12, referred to as "gate driver 830") to the respective first driving circuits 300-1 included in the display panel 1000 and/or 1000'. However, the respective gate signal lines may include a Sense line (Sense 1 to Sense n), a SPWM line (SPWM 1 to SPWM n), and a SPAM line (SPAM 1 to SPAM n).

The panel driver 800 may be controlled by the processor 900 to drive the display panel 1000 and/or 1000' (in more detail, each of the plurality of first driving circuits 300-1), and may include a timing controller 810, a data driver 820, and a gate driver 830.

The timing controller 810 may receive an input signal IS, a horizontal synchronizing signal Hsync, a vertical synchronizing signal Vsync and a main clock signal MCLK from the outside, and generate an image data signal, a scanning control signal, a data control signal, a data control signal, a light emission control signal, and the like to the display panel 1000 and/or 1000' and provide the generated signals to the display panel 1000 and/or 1000', the data driver 820, the gate driver 830, and the like.

For example, the timing controller 810 may, according to various embodiments, apply a control signal (Ref), a control signal (Sweep), a control signal (RES), a control signal (Control), and a control signal (MUX Sel R, G, B) to the first driving circuit 300-1.

The data driver 820 (or source driver) may, as a means for generating a data signal, receive an image data of an R/G/B component from the processor 900 and generate a data signal (for example, a particular voltage, an amplitude setup voltage, and a pulse width setup voltage). In addition, the data driver 820 may apply the generated data signal to the display panel 1000 and/or 1000'.

The gate driver 830 may, as a means for generating various control signals such as a control signal (Sense), a control signal (SPWM), a control signal (SPAM), and the like, transfer the generated various control signals to a particular column (or a particular horizontal line) of the display panel 1000 and/or 1000'.

For example, in the first driving circuit 300-1 to which the control signal (Sense) has been transferred, the first transistor 340 may be turned on and a current flowing through the driving transistor 325 may be sensed through the data line 5. In addition, in the first driving circuit 300 and 700 to which the control signal (SPAM) has been transferred, the second transistor 311 may be turned on and an amplitude setup voltage output from the data driver 820 may be transferred through the data line 5. In addition, in the first driving circuit 300 and 700 to which the control signal (SPAM) has been transferred, the third transistor 336 may be turned on and a pulse width setup voltage output from the data driver 820 may be transferred through the data line 5.

To this end, the gate driver 830 may be configured and operated as described with reference to FIGS. 10A, 10B, 10C, 11A, 11B and 11C.

In addition, the gate driver 830 may apply a driving voltage (VDD) to the driving voltage terminal 321 of the first driving circuit 300-1 according to an embodiment.

Some or all of the data driver 820 and the gate driver 830 may, as described above, be included in the driving circuit layer 300 and/or 300' disposed on one surface of the glass 100 of the display panel 1000 and/or 1000' or implemented as an additional semiconductor integrated circuit (IC) and arranged on the other surface of the glass 100.

The processor 900 may include various processing circuitry and controls overall operations of the display apparatus 1200. In particular, the processor 900 may control the panel driver 800 to drive the display panel 1000 and/or 1000' so that the first and second driving circuits 300-1 and 300-2 perform the operations described above.

To this end, the processor 900 may include one or more of a central processing unit (CPU), micro-controller, application processor (AP), communication processor (CP), ARM processor, or the like.

For example, according to an embodiment, the processor 900 may set a pulse width of a driving current according to a pulse width setup voltage, and control the panel driver 800 to set amplitude of the driving current according to an amplitude setup voltage. In a case that the display panel 1000 and/or 1000' includes n columns and m rows, the processor 900 may control the panel driver 800 to set an amplitude or pulse width of the driving current by the column (by the horizontal line).

Thereafter, the processor 900 may apply a driving voltage (VDD) at once to the light emitting device 200 via the current source 320 of the first and second driving circuits 300-1 and 300-2, and control the panel driver 800 to apply a linear shift voltage (sweep signal) to a PWM driving circuit 340 of each of the first and second driving circuits 300-1 and 300-2, and thereby an image can be displayed.

In this case, the detail of the processor 900 controlling the panel driver 800 to control operations of the first and second driving circuits 300-1 and 300-2 included in the display panel 1000 and/or 1000' is as described above and thus, the overlapped description will be omitted.

In the example described above, the processor 900 and the timing controller 810 are separate elements. However, the timing controller 810 may perform a function of the processor 900 without the processor 900.

In the example described above, the light emitting device 200 is a micro LED, but is not limited thereto. That is, according to an embodiment, even when the light emitting device 200 is an LED of a size greater than or equal to 100 micrometers, the first and second driving circuits 300-1 and 300-2 according to the various embodiments described above may be applied.

In addition, in the example described above, the display panel 1000 and/or 1000' is a chip-on-glass (COG) type, but according to an embodiment, the first and second driving circuits 300-1 and 300-2 according to the various embodiments described above may be applied to a display panel of a chip-on-board (COB) type. As for a display panel of a COB type, a substrate is used instead of the glass 100 unlike the COG type. In this case, a hole penetrating the substrate is formed and one surface of the substrate and the other surface of the substrate are electrically connected through the hole, and thereby the driving circuit layer 300 provided on one surface of the substrate and various circuits provided on the other surface of the substrate can be electrically connected to each other.

According to an embodiment, the display panel 1000 and/or 1000' may be implemented as an independent display panel without extensibility. However, the example is not limited thereto, and the display panel 1000 and/or 1000' may be implemented as an extensible display module included in some of a large-area tiled display.

According to the various embodiments, a wavelength shift according to a grayscale or gradation of a light emitting device included in a display panel can be prevented. In addition, it is possible to correct a stain or color of the light emitting device included in the display panel. In addition, even in a case that a large-area tiled display panel is configured by combining a display panel in the form of a plurality of modules, a difference of brightness or color among the respective modular display panels can be corrected.

The above-described embodiments may be implemented as a software program including an instruction stored on machine (e.g., computer)-readable storage media. The machine is an apparatus which is capable of calling a stored instruction from the storage medium and operating according to the called instruction, and may include a display apparatus 1200 according to the above-described embodiments.

When the command is executed by a processor, the processor may perform a function corresponding to the command directly or using other components under the control of the processor. The command may include a code generated or executed by a compiler or an interpreter. A machine-readable storage medium may be provided in the form of a non-transitory storage medium. Herein, the term "non-transitory" only denotes that a storage medium does not include a signal but is tangible, and does not distinguish the case where a data is semi-permanently stored in a storage medium from the case where a data is temporarily stored in a storage medium.

According to an embodiment, the method according to the above-described various embodiments may be provided as being included in a computer program product. The computer program product may be traded as a product between a seller and a consumer. The computer program product may be distributed online in the form of machine-readable storage media (e.g., compact disc read only memory (CD-ROM)) or through an application store (e.g., Play Store™). In the case of online distribution, at least a portion of the computer program product may be at least temporarily stored or temporarily generated in a server of the manufacturer, a server of the application store, or a storage medium such as memory.

Each of the components (e.g., module or program) according to the various embodiments may include a single entity or a plurality of entities, and some of the corresponding sub components described above may be omitted, or another sub component may be further added to the various embodiments. Alternatively or additionally, some components (e.g., module or program) may be combined to form a single entity which performs the same or similar functions as the corresponding elements before being combined. Operations performed by a module, a program, or other component, according to various exemplary embodiments, may be sequential, parallel, or both, executed iteratively or heuristically, or at least some operations may be performed in a different order, omitted, or other operations may be added.

Although embodiments of the present disclosure have been illustrated and described, it should be understood that the present disclosure is not limited to the disclosed embodiments and may be variously changed without departing from the spirit and the scope of the present disclosure. While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A display panel comprising:
    a driving circuit layer disposed on a glass, the driving circuit layer comprising a plurality of first driving circuits; and
    a plurality of inorganic light emitting devices mounted on the driving circuit layer and electrically connected to the plurality of first driving circuits, respectively, each of the plurality of inorganic light emitting devices comprising a sub pixel of the display panel,
    wherein a first driving circuit from among the plurality of first driving circuits comprises:
        a pulse amplitude modulation (PAM) driving circuit configured to control an amplitude of a driving current provided to an inorganic light emitting device from among the plurality of inorganic light emitting devices; and
        a pulse width modulation (PWM) driving circuit configured to control a light emitting duration of the inorganic light emitting device,
    wherein a deviation of amplitude of the driving current provided to the inorganic light emitting device is compensated by correcting a data voltage applied to the first driving circuit to set the amplitude of the driving current provided to the inorganic light emitting device.

2. The display panel as claimed in claim 1, wherein the display panel further comprises:
    a plurality of pixels arranged in a matrix, each pixel from among the plurality of pixels comprising an R sub pixel comprising a red (R) inorganic light emitting device, a G sub pixel comprising a green (G) inorganic light emitting device, and a B sub pixel comprising a blue (B) inorganic light emitting device,
    wherein each sub pixel from among the R, G and B sub pixels corresponds to each of the plurality of first driving circuits.

3. The display panel as claimed in claim 2, wherein the first driving circuit from among the plurality of first driving circuits comprises a first transistor connected to a data line and a current source, the first transistor being configured to provide a current flowing through the current source to the inorganic light emitting device based on a signal supplied by the data line,
    wherein the PAM driving circuit comprises a second transistor which is connected to the data line,
    wherein the PAM driving circuit is configured to perform a PAM control for the inorganic light emitting device according to an amplitude setup voltage input via the second transistor, the amplitude setup voltage being corrected based on the current flowing through the current source to the inorganic light emitting device,
    wherein the PWM driving circuit comprises a third transistor which is connected to the data line, and wherein the PWM driving circuit is configured to perform a PWM control for the inorganic light emitting device based on a pulse width setup voltage input via the third transistor.

4. The display panel as claimed in claim 3, wherein the driving circuit layer comprises a second driving circuit to generate control signals for driving the plurality of first driving circuits and provide the generated control signals to the plurality of first driving circuits,
   wherein the second driving circuit comprises a first driver configured to generate, for each image frame from among a plurality of image frames, a first control signal that turns on respective first transistors that correspond to pixels arranged in a first line from among a plurality of lines of the matrix, and
   wherein the first driver is configured to provide the generated first control signal to the respective first transistors corresponding to the pixels arranged in the first line.

5. The display panel as claimed in claim 4, wherein the first driver is configured to:
   for a first image frame from among the plurality of image frames, generate the first control signal for turning on the respective first transistors corresponding to the pixels arranged in the first line, and
   for a second image frame, generate the first control signal for turning on respective first transistors corresponding to pixels arranged in a second line following the first line.

6. The display panel as claimed in claim 4, wherein the first driver comprises a first circuit for each line from among the plurality of lines of the matrix,
   wherein each respective first circuit is configured to generate the first control signal for a corresponding line from among the plurality of lines, and
   wherein an output signal of each first circuit is input as a start signal of the first circuit for a following line.

7. The display panel as claimed in claim 3, wherein the driving circuit layer comprises a second driving circuit to generate control signals for driving the plurality of first driving circuits and provide the generated control signals to the plurality of first driving circuits,
   wherein the second driving circuit comprises a second driver configured to generate, for each image frame from among a plurality of image frames, second and third control signals that turn on respective second and third transistors that correspond to pixels arranged in a first line from among a plurality of lines of the matrix, and
   wherein the second driver is configured to provide the generated second and third control signals to the respective second and third transistors corresponding to the pixels arranged in the first line.

8. The display panel as claimed in claim 7, wherein the second driver is configured to generate and provide the third control signal sequentially for each line from among the plurality of lines of the matrix, and
   wherein the second driver is configured to, after generating and providing the third control signal, generate and provide the second control signal for each line from among the plurality of lines of the matrix.

9. The display panel as claimed in claim 7, wherein the second driver comprises two second circuits for each line from among the plurality of lines of the matrix,
   wherein, for each line from among the plurality of lines, one of the two respective second circuits is configured to generate the second control signal for the line,
   wherein, for each line from among the plurality of lines, the other of the two respective second circuits is configured to generate the third control signal for the line,
   wherein the respective second circuit for each line is configured to receive an output signal of a second circuit of a previous line as a start signal, and
   wherein an output signal of the respective second circuit for each line is input as a reset signal to the second circuit of the previous line.

10. The display panel as claimed in claim 2, wherein the driving circuit layer further comprises at least one of:
    a MUX (multiplexer) circuit configured to select one of the R, G and B sub pixels;
    an electro static discharge (ESD) circuit configured to discharge static electricity occurring in the display panel;
    a power circuit configured to supply driving power to the plurality of first driving circuits; and
    a clock provision circuit configured to provide a clock signal to drive the plurality of first driving circuits and a second driving circuit for providing control signals to the plurality of first driving circuits.

11. The display panel as claimed in claim 1,
    wherein the first driving circuit comprises a plurality of transistors configured to correct a deviation of pulse width of the driving current provided to the inorganic light emitting device.

12. The display panel as claimed in claim 1, wherein the inorganic light emitting device comprises a micro-light emitting diode (LED) of a size less than or equal to 100 micrometers.

* * * * *